(12) United States Patent
Poh

(10) Patent No.: US 7,259,955 B2
(45) Date of Patent: Aug. 21, 2007

(54) ELECTROSTATIC HOLDING DEVICE AND ELECTROSTATIC TWEEZERS USING THE SAME

(75) Inventor: Fow-Lai Poh, Mooka (JP)

(73) Assignee: Tsukuba Seiko Ltd., Mooka-shi (JP)

( * ) Notice: Subject to any disclaimer, the term of this patent is extended or adjusted under 35 U.S.C. 154(b) by 0 days.

(21) Appl. No.: 10/529,382

(22) PCT Filed: Sep. 25, 2003

(86) PCT No.: PCT/JP03/12225

§ 371 (c)(1),
(2), (4) Date: Mar. 28, 2005

(87) PCT Pub. No.: WO2004/030197

PCT Pub. Date: Apr. 8, 2004

(65) Prior Publication Data

US 2006/0023393 A1 Feb. 2, 2006

(30) Foreign Application Priority Data

Sep. 27, 2002 (JP) ............................ 2002-282483
May 9, 2003 (JP) ............................ 2003-131016

(51) Int. Cl.
*H01L 21/683* (2006.01)
*H01T 23/00* (2006.01)
*H01G 7/02* (2006.01)
*H05F 3/00* (2006.01)

(52) U.S. Cl. ........................... 361/234; 361/233

(58) Field of Classification Search ............... 361/234, 361/233
See application file for complete search history.

(56) References Cited

U.S. PATENT DOCUMENTS

| 4,751,609 A | * | 6/1988 | Kasahara ..................... 361/234 |
| 5,789,843 A | | 8/1998 | Higuchi et al. |
| 5,997,962 A | | 12/1999 | Ogasawara et al. |
| 6,778,377 B2 | * | 8/2004 | Hagi ........................... 361/234 |

FOREIGN PATENT DOCUMENTS

| JP | A 62-255039 | 11/1987 |
| JP | A 4-162443 | 6/1992 |

(Continued)

*Primary Examiner*—Stephen W. Jackson
*Assistant Examiner*—Dharti H Patel
(74) *Attorney, Agent, or Firm*—Oliff & Berridge, PLC

(57) ABSTRACT

An electrostatic holding device (100) in which an electrode group (103) having a plurality of electrodes covered with an insulating material (102) is used as a holding surface applies predetermined voltage to the electrode group (103) to hold a holding object (104) by an electrostatic force with a contact state or with a floating non-contact state. The electrostatic holding includes an internal polarization eliminating device (applied voltage control portion 105) to eliminate the internal polarization generating in the insulating material (102) by switching the polarity of voltage to be applied to the electrode group (103). There are provided with the electrostatic holding device in which the electrostatic attraction does not deteriorate by usability, and electrostatic tweezers in which the electrostatic attraction does not deteriorate when the tweezers are manually used.

14 Claims, 14 Drawing Sheets

FOREIGN PATENT DOCUMENTS

| | | |
|---|---|---|
| JP | B2 4-58274 | 9/1992 |
| JP | A 6-155214 | 6/1994 |
| JP | B2 7-4718 | 1/1995 |
| JP | A 7-257751 | 10/1995 |
| JP | A 10-66367 | 3/1998 |
| JP | B2 2879887 | 1/1999 |
| JP | A 2000-326242 | 11/2000 |
| JP | A 2001-9766 | 1/2001 |
| JP | A 2002-270682 | 9/2002 |
| JP | A 2003-282671 | 10/2003 |
| WO | WO95/25689 | 9/1995 |

* cited by examiner

FIG.19
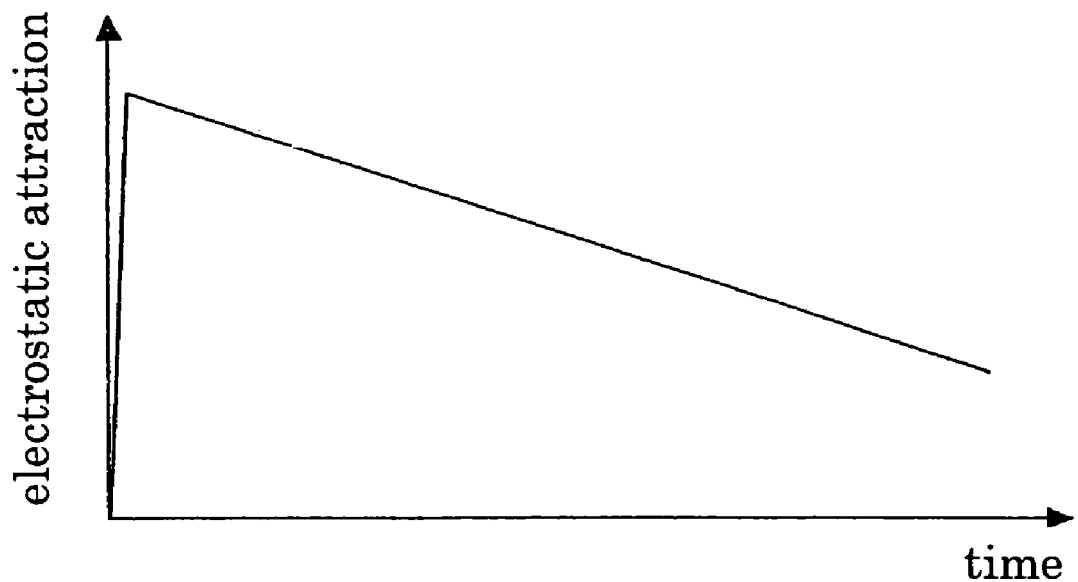

ELECTROSTATIC HOLDING DEVICE AND ELECTROSTATIC TWEEZERS USING THE SAME

TECHNICAL FIELD

The present invention relates to an electrostatic holding device for holding an object such as a thin plate by electrostatic attraction with a contact state or non-contact state, and electrostatic tweezers using the same.

BACKGROUND OF ART

Conventionally, there has been used a vacuum chuck as a general holding device for holding an object. However, when a thin plate is used as an object, the vacuum chuck is disadvantageous in that the periphery of the thin plate flexes. At the same time, according to an electrostatic holding device such as an electrostatic chuck, since an object can be held by the electrostatic force of the entire electrode plane, the periphery of the thin plate does not flex even when the thin plate is handled (held) (for example, reference to Japanese Patent Laid-Opens H7-257751, H9-322564. H10-66367, 2001-9766).

There have been known electrostatic holding devices illustrated in FIGS. 13, 15, and 17 as the above electrostatic holding device.

Here, in an electrostatic holding device (electrostatic chuck) of contact type 1100 shown in FIG. 13, a reference numeral 101 denotes a base member for attaching an electrode (electrostatic electrode) 103, and the electrode (electrode group) 103 including an electrode element 103a and an electrode element 103b, which is covered with an insulating material 102, is secured to the base member 101. In this case, a plurality of electrode elements 103a, 103b can be used respectively, and when a plurality of electrode elements 103a, 103b is used, electrode elements 103a, 103b are shown as an electrode element group 103a, 103b respectively.

These electrodes 103 are connected to a control portion (controller) 1105, which is connected to a switch SW. By means of ON/OFF operation of the switch SW, the control portion 1105 outputs a predetermined voltage (for example, +V1 to the electrode element 103a and −V1 to the electrode elements 103b) when the switch SW is turned on, and disconnects the voltage when the switch SW is turned off, as illustrated in FIG. 14. Therefore, when the switch SW is turned on, the electrostatic attraction is induced between the electrode (electrode surface) 103 and a handling object 104, and the handling object 104 is attracted to be held to a holding surface (attachment holding surface) 102a of the insulating material 102 by the electrostatic attraction. In addition, when the switch SW is turned off, the electrostatic attraction is removed. Accordingly, the electrostatic holding device 1100 functions as an electrostatic chuck by attracting the handling object 104 such as electric conductor, semiconductor, or high-resistance body with the electrostatic attraction or by eliminating the electrostatic attraction.

In an electrostatic holding device (electrostatic chuck) 1200 of floating type shown in FIG. 15, a surface (electrode surface 103) of an electrode 103 is covered with an insulating material 102, and the insulating material 102 is secured to a base plate 101. A displacement sensor 206 is provided to feedback a gap g (separation) between the electrode surface 103 and a handling object 104 such as electric conductor, semiconductor, or high-resistance body with an actual time.

The displacement sensor 206 passes through a through-hole 207 to measure the gap g between the handling object 104 and the electrode surface 103, and feedbacks the gap g to a controller 1205. The controller 1205 controls an applied voltage based on the measured gap g, and keeps the gap g in a previously set predetermined value. For instance, as illustrated in FIG. 16, when the gap g is larger than a target gap (gap>target), the controller applies predetermined direct-current voltage to induce the electrostatic attraction; thus the handling object 104 is attracted by the electrostatic attraction to reduce the gap g.

On the other hand, when the gap g is smaller than the target gap (gap<target), the controller disconnects the voltage to be applied to each of the electrodes (as 0V) to eliminate the attraction to the handling object 104; thus, the handling object 104 is lowered by the own weight to increase the gap g. The handling object 104 can be held to a predetermined gap g by repeating the above operations.

In an electrostatic holding device 1300 shown in FIG. 17, a pair of electrode element groups 503a, 503b is covered with an insulating member 102 which is secured to a base member 101. A control portion 1305 applies predetermine voltage to these electrode element groups 503a, 503b. Therefore, the electrostatic force is induced, and the handling object 104 is attracted to be held to the surface of the insulating material 102 (holding surface 102a) with the electrostatic attraction.

DISCLOSURE OF INVENTION

However, in the electrostatic chucks 1100, 1200 shown in FIGS. 13, 15, the deterioration of the electrostatic attraction (hereinafter, sometimes simply refereed to attraction) is observed along with the operation. The deterioration of the attraction differs by the use of the electrostatic chucks.

For example, when the electrostatic chuck is used with being attached to an automatic machine, the deterioration of the attraction is not remarkable, but when the electrostatic chuck is manually handled, the deterioration of the attraction is remarkably observed. If the attraction is deteriorated, necessary handling can not be carried out. Accordingly, it is desired to provide an electrostatic holding device capable of generating the sufficient electrostatic attraction even when the handling is manually carried out.

In addition, in the conventionally proposed electrostatic chuck, it was necessary for the insulating material 102 to have high electric resistance. This is because, when the electric resistance of the insulating material 102 is not sufficient, the once induced electrostatic attraction is deteriorated as time passes although the voltage is kept applied to the electrode surface. If the electric resistance is not sufficient, the electrostatic field between the surface of the electrode 103 and the handling object 104 deteriorates as time passes by a small amount of current flowed between the electrode element 103a and the electrode element 103b. The foregoing deterioration of the electrostatic force is also confirmed by small short in which the chuck and the handling object 104 are not physically destroyed.

On the other hand, a method for covering the surface of the electrode 103 with the insulating material 102 includes an insulation method for putting an insulator film on one surface side of the electrode 103 through adhesive and an insulation method for directly applying a layer of insulating material on one surface side of the electrode 103 by means of vapor deposition and the like.

The method for using the adhesive can cover the surface of the holding surface 102a side of the electrode 103 with a price lower than that of the layer of the insulating material; however, the layer of the adhesive is provided between the electrode elements 103a, 103b. Generally, the layer of the adhesive does not include high electric resistance, so that this method can insulate between the surface of the electrode 103 and the handling object 104 by the insulator film. However, the electrode elements 103a, 103b are insulated only by the layer of the adhesive, so that the electric insulation is not high. Accordingly, a small amount of current flows between each of the electrode elements 103a, 103b, and the electrostatic field disorders along with the flow of the small amount of current between each of the electrode elements 103a, 103b. Moreover, there may be a case that the surface of the electrode 103 is destroyed by a large amount of current flowed between each of the electrode elements 103a, 103b.

The insulation method by the vapor deposition and the like can maintain high insulating resistance, but a process for entirely forming a thickness d of the insulating layer (thickness of insulating material) of the attachment holding surface 102a (reference to FIG. 17) in a reduced thickness of 150 µm is expensive, and results in driving up the cost of the electrostatic holding device.

It is, therefore, an object of the present invention to provide an electrostatic holding device without deteriorating electrostatic attraction by usability.

It is another object of the present invention to provide electrostatic tweezers without deteriorating electrostatic attraction when the tweezers are manually used.

It is a further object of the present invention to provide an electrostatic holding device capable of generating a sufficient electrostatic field and electrostatic force even when an insulating material having relatively low insulating resistance is used.

PROBLEMS TO BE SOLVED BY THE INVENTION

In order to solve the above problems, after the keen study of the inventors, they have found out the factor deteriorating the attraction when an electrostatic holding device is manually used. The deterioration of the attraction results in the electrostatic holding device in which the ON state of the switch is often kept when the handling object 104 is not around the electrostatic holding device.

For example, in the electrostatic holding device 1100 manufactured by using a material having volume resistance of $10^{15}$ Ω·cm as the insulating material 102, the deterioration in the attraction was not remarkable with the state that the handling object 104 was at a short distance (not over 1 mm); however, when the voltage was kept applied about three minutes with the state that the handing object 104 was not around, the handling object was not attracted even though the next voltage was applied. It has also been confirmed that this attraction is recovered as time passes, but the recovery requires several hours.

Consequently, the present inventors have presumed that this reason is based on the internal polarization of the insulating material 102 covering the electrode surface.

More particularly, the insulating material uses a material whose resistance is high in order to satisfy the insulating purpose. Here, the internal polarization of the insulating material generally comprises electronic polarization, atomic polarization, dipole polarization, space-charge polarization and the like. The electronic polarization and the atomic polarization correspond to the speeds of electronic oscillation and atomic vibration, respectively, so that the internal polarization is instantaneously eliminated when the external electric field is disconnected (applied voltage is disconnected). Accordingly, the electronic polarization and the atomic polarization have no substantial influence. However, in the dipole polarization and the space-charge polarization, a strong external electric field is required for the development and progress of the internal polarization, and when the internal polarization once developed and advanced, the relaxation time required for removing the internal polarization becomes long such as about several hours.

Consequently, the present inventors have assumed that this internal polarization can affect to the insulating material of the conventional electrostatic holding device by the development and progress of the dipole polarization and the space-charge polarization. In other words, with the state that the internal polarization exists in the insulating material, the electrostatic attraction with respect to the handling object 104 weakens due to the disorder of the electric field when attracting the handling object 104 by applying the voltage. The weakening degree of the electrostatic attraction is dependant on the existence degree of the dipole polarization and the space-charge polarization in the insulating material. However, the progress degree of the dipole polarization and the space-charge polarization depends on the components of the insulating material and the external electric field (applied voltage and electrode shape), and also depends on the applied time.

With a state that the external electric field in the opposite direction does not exist, the dipole polarization and the space-change polarization require a long relaxation time of about several hours to eliminate the internal polarization. However, the dipole polarization and the space-change polarization can be instantly eliminated or relaxed by applying the external electric field in the direction opposite to the polarization direction.

Consequently, in the electrostatic holding device with the attraction being deteriorated, the present inventors have found out that the attraction is instantly recovered when the voltage whose polarity is opposite to the applied voltage previously applied to the same electrode group is applied to the same electrode group; thus, the present inventors have reached to the present invention.

The present invention is an improvement of an electrostatic holding device in which an electrode group including a plurality of electrodes covered with an insulating material is used as a holding surface, and predetermined voltage is applied to the electrode group to hold a holding object by an electrostatic force with a contact state or with a floating non-contact state.

An electrostatic holding device of a first invention comprises an internal polarization eliminating device to eliminate an internal polarization generating in the insulating material by switching the voltage to be applied to the electrode group.

An electrostatic holding device of a second invention comprises an applied voltage control portion functioning as an applied voltage switching device configured to apply the voltage whose polarity is opposite to the previously applied voltage to the same electrode group whenever switching the applied voltage to the electrode group from disconnecting to applying.

An electrostatic holding device of a third invention comprises an applied voltage control portion functioning as a voltage of reversed polarity generating device configured to generate the voltage whose polarity is opposite to the voltage to be applied to the electrode group at the time of handling, and configured to be capable of applying the voltage of the reversed polarity generated by the voltage of reversed polarity generating device to the electrode group when the electrostatic force deteriorates.

An electrostatic holding device of a fourth invention comprises an applied voltage control portion functioning as voltage applying device configured to apply the applied voltage to the electrode group by alternately changing to the reversed polarity.

According to the above electrostatic holding device, the holding object can be held by the electrostatic force of the holding surface with a contact state or non-contact state (electrostatic floating).

As the first invention, by including the internal polarization eliminating device configured to eliminate the internal polarization generating in the insulating material by switching the polarity of voltage to be applied to the electrode group, even if the internal polarization progresses in the insulating material by applying the voltage to the electrode group with the state that the holding object is not held, the internal polarization can be eliminated or relaxed by the internal polarization eliminating device; thus, the attraction can be recovered.

In addition, as the second invention, if the applied voltage control portion functioning as the applied voltage switching device configured to apply the voltage whose polarity is opposite to the previously applied voltage to the same electrode group whenever switching the applied voltage to the electrode group from disconnecting to applying is used, the voltage whose polarity is opposite to the previously applied voltage is applied to the same electrode group; thus, the internal polarization is instantly eliminated and relaxed, and the attraction can be quickly recovered even if the internal polarization progresses in the insulating material.

As the third invention, if the applied voltage control portion functioning as the voltage of reversed polarity generating device configured to generate the voltage whose polarity is opposite to the voltage to be applied to the electrode group at the time of handling, and is configured to be capable of applying the voltage of the reversed polarity generated by the reversed polarity voltage generating device to the electrode group when the electrostatic force deteriorates by the generation of the internal polarization in the insulating material is used, the internal polarization is instantly eliminated and relaxed, and the attraction can be quickly recovered by actively applying the voltage of reversed polarity generated by the voltage of the reversed polarity generating device to the electrode group when the electrostatic force deteriorates resulting in the internal polarization in the insulating material.

As the fourth invention, if the applied voltage control portion functioning as the voltage applying device configured to alternately apply the voltage of reversed polarity of positive and negative to the electrode group is used, the voltage of the reversed polarity of positive and negative is alternately applied to the electrode group; thus, the internal polarization is not developed in the insulating material, and the deterioration of the electrostatic attraction based on the internal polarization can be prevented.

The above-described electrostatic holding devices can be adopted as a grasping device to grasp various thin films such as a semiconductor wafer, or can stably hold the object for a long time. Therefore, the availability of the electrostatic holding devices are expected as a stage (holding base) for holding a semiconductor wafer when in processing, and also expected to be applied to a transportation device of thin film such as a semiconductor wafer.

In addition, the above electrostatic holding devices are effectively used especially when the electrostatic holding device is manually used such as electrostatic tweezers which tend to improperly apply the voltage to the electrode surface with the state that the handling object is not in the vicinity of the holding surface.

In an electrostatic holding device of the present invention, comprising an control portion for controlling the voltage to be applied to the electrode, configured to hold a holding object by electrostatic force with a contact state or to hold the holding object with a floating non-contact state, the electrode includes a pair or two or more pairs of an electrode A and an electrode B adjacently disposed through an insulating area, and the control portion applies the voltage whose polarities are opposite to each other to the electrode A and the electrode B, and alternately applies the voltage of reversed polarity of positive and negative to the same electrode element.

According to the above structure, the voltage whose polarities are opposite to each other can be applied to the electrode A and the electrode B, and the voltage of the reversed polarity of positive and negative is alternately applied to the same electrode element; therefore, a small amount of current is minimized in the insulating layer whose insulating resistance is relatively low, and the electrostatic field between the electrode surface and the handling object can be kept in high. Accordingly, if the insulating layer whose insulating resistance is relatively low is used, a sufficient electrostatic field and a sufficient electrostatic force can be generated with time, so that it is possible to provide the electrostatic holding device to hold the holding object by using the electrostatic force for a short time or a long time with a contact state or a non-contact state.

The electrostatic holding device comprises a plurality of electrode modules, and the electrode modules comprise a pair or two or more pairs of the electrode A and the electrode B, respectively; thus, the electrostatic holding device can be used as a holding device to hold a holding object of large area.

In addition, according to the electrostatic holding device, the object can be held by the electrostatic force of the entire electrode surface with a contact state or a non-contact state (electrostatic floating), and also can be held by a predetermined holding force when the holing time is long, and also the periphery of the thin plate does not flex when handing (holding) the thin plate. The thin film can be moved by an appropriate technique, and the electrostatic holding device is used as a grasping device to grasp various thin films such as a semiconductor wafer. Since the object can be stably held for a long time, the availability of the electrostatic holding device is expected as a stage (holding base) for holding a semiconductor wafer in processing. It is also expected to be applied to a transportation device of thin film such as a semiconductor wafer.

EFFECTS OF THE INVENTION

According to the present invention, it is possible to provide an electrostatic holding device in which electrostatic attraction does not deteriorate by usability. In addition, the electrostatic force does not deteriorate even when the electrostatic holding device is manually used; thus, the electrostatic holding device can be used as electronic tweezers.

According to the present invention, it is possible to provide an electrostatic holding device capable of generating a sufficient electronic field and a sufficient electrostatic force with time although an insulating material whose insulating resistance is relatively low is used.

BRIEF DESCRIPTION OF DRAWINGS

FIG. 19 is a view illustrating temporal changes in the generated electrostatic force of a conventional electrostatic chuck.

Figure 1:
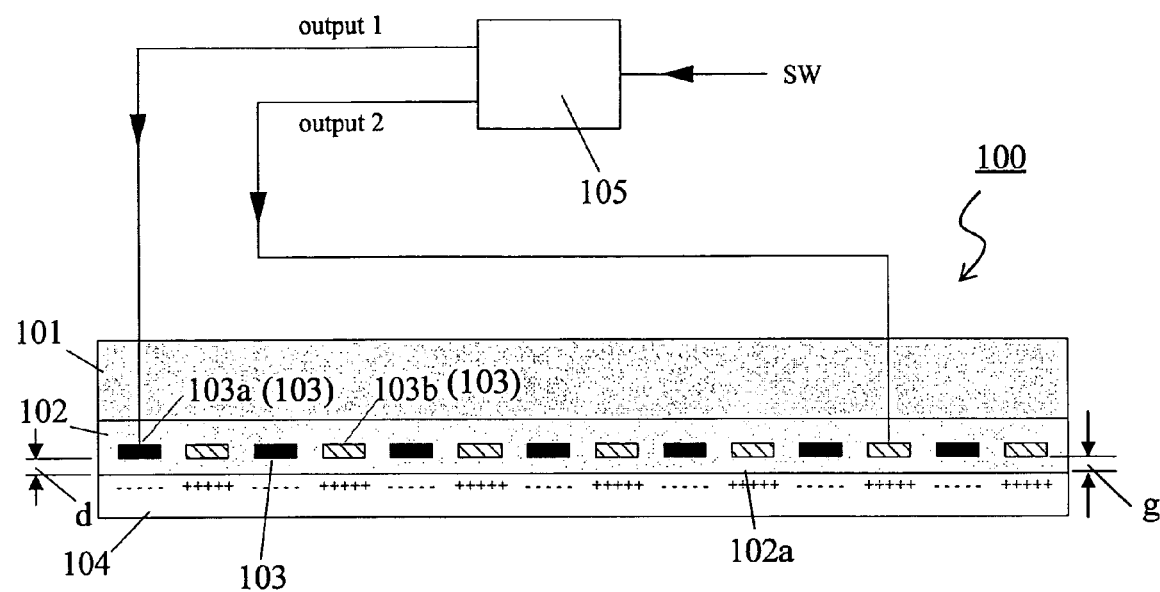
FIG. 1 is a cross sectional view explaining an example of an electrostatic holding device of contact type according to the present invention.

Here, reference numerals 100, 200, 300, 400, 700, 800, 1100, 1200, 1300, 1400 represent an electrostatic holding device (electrostatic chuck) respectively. Reference numerals 101, 102, 102a, and 103 represent a base member, an insulating material, a holding surface of the insulating material, and electrode, electrode group or electrode surface, respectively. Reference numerals 103a, 103b denote an electrode element or an electrode group respectively.

In addition, a reference numeral 104 denotes a handling object (holding object). Reference numerals 105, 205, 305, 405, 705, 805, 1105, 1205, 1305, 1405 represent a controller (control portion), respectively, and the reference numerals 105, 205, 305, 405, 705, 805 respectively comprise an applied voltage control portion functioning as an internal voltage switching device, a voltage of reversed polarity generating device, internal polarization eliminating device and the like by itself or with another device such as a switch SW. A reference numeral 206 represents a displacement sensor, and a reference numeral 207 denotes a through hole for disposing the displacement sensor 206.

BEST MODE FOR CARRYING OUT THE INVENTION

Hereinafter, an electrostatic holding device according to the present invention will be explained based on the drawings. The same reference numerals are applied to the substantially same or the similar portions; thus, the detailed descriptions will be sometimes omitted.

FIG. 1 is a schematic diagram explaining a general idea of an electrostatic holding device of contact supporting type according to an embodiment of the present invention, and shows a cross section view when the electrostatic holding device is cut by a cross section passing through the center orthogonal to an electrode surface of an electrostatic holding device.

In FIG. 1, a reference numeral 100 denotes an electrostatic holding device of contact type. An insulating material 102 is applied to one surface of a base member 101. An electrode group 103 is buried in the insulating material 102 with the periphery of electrode group 103 being covered with the insulating material 102. The electrode group 103 comprises two electrode element groups 103a, 103b. In this case, a material having high insulating resistance is used for the insulating material 102 in order to insulate between the electrode element groups 103a, 103b and between the electrode group 103 and a handling object 104.

The electrostatic attraction to be generated in this case is inversely proportional to the square of the distance between the handling object 104 and the surface of the electrode group 103 (gap g, same as the thickness d of the insulating material in this case). In order to induce sufficient electrostatic attraction, it is necessary for the thickness d of the insulating material 102 to be thinly formed as far as satisfying the withstand voltage. The thickness d of the insulating material is generally about 100 μm.

Figure 2:
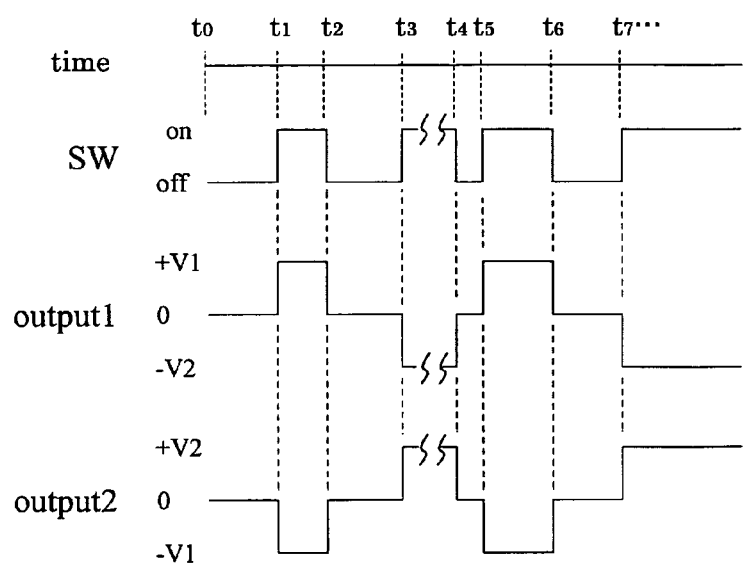
FIG. 2 is a diagram explaining waveforms of voltage to be applied to the electrode of the electrostatic holding device shown in FIG. 1.

The electrode group 103 (electrode element groups 103a, 103b) is connected with the controller 105. As shown in FIG. 2, the controller 105 is adopted to apply the voltage whose polarity is opposite to the previously applied voltage to the same electrode every time switching the applied voltage to the electrode group 103 (electrode element groups 103a, 103b) from disconnecting to applying in conjunction with the switch SW. Here, the controller 105 comprises an applied voltage control portion functioning as an applied-voltage switching device.

Next, loading and unloading of the handling object 104 using the above electrostatic holding device 100 will be described.

For example, with a state that the handling object 104 as the holding object is brought into contact with the insulating material 102 as the holding surface 102a, the switch SW is switched to the applied state from the disconnected state. If the time is adopted as t1, in the time t1, +V1 of positive voltage is applied from the output 1 of the controller 105 to the electrode element group 103a, and −V1 of negative voltage whose polarity is opposite to the output 1 is output from an output 2 to the electrode element group 103b. Electrostatic is accordingly induced between the surface of the electrode group 103 and the handling object 104 to attract the handling object 104 such as electric conductor, semiconductor, and high-resistance body to the insulating material 102 by the electrostatic attraction; thus, the handling object 104 can be held to the insulating material 102 (loading).

Next, when the switch SW is turned off in the time t2, each of the outputs from the output 1 and the output 2 becomes 0V. Accordingly, the electrostatic attraction is eliminated, and the holding of the handling object 104 can be dissolved (unloading).

Next, when the switch SW is improperly (or by mistake) turned on for a long time in t3 with a state that the handling object 104 is not around, predetermined voltage is kept applied to the electrode 103 with the state that the handling object 104 is not around. For example, if the predetermined voltage is kept applied to the electrode over 3 minutes with the state that the handling object 104 is not around, internal polarization according to each of the polarities progresses in the insulating material 102 of the surface of the electrode group 103 as time passes. More particularly, the internal polarization progresses based on the negative voltage of the output 1 in the insulating material 102 in the vicinity of the electrode element group 103a, and the internal polarization progresses based on the positive voltage of the output 2 in the insulating material 102 in the vicinity of the electrode element group 103b. As a result, even if the handling object 104 is subsequently brought into contact with the insulating material 102 as the holding surface, the electrostatic attraction based on the output 1 and the output 2 is weakened by the advanced internal polarization; thus, the handling object 104 can not be attracted and held to the insulating material 102.

In this case, the switch SW is once disconnected in t4, and then the switch SW is again turned on in t5 with the state that the handling object is brought into contact with the insulating material 102. Since the controller 105 used in the first embodiment of the present invention is set to apply the voltage whose polarity is opposite to the polarity of the applied voltage applied with the previous ON state to the same electrode elements, in the time t5, +V1 of positive voltage whose polarity is opposite to the previous ON state is applied from the output 1 to the electrode element group 103a, and −V1 of negative voltage whose polarity is opposite to the previous ON state is output from the output 2 to the electrode element group 103b. Therefore, the internal polarization is instantly disappeared by applying the voltage denying the internal polarization advanced in the insulating material 102 of the surface of the electrode group 103. Moreover, in the present invention, an object for applying the voltage of reversed polarity is to dissolve the internal polarization instantly, so that it is not necessary for V1 and V2 to have an equal absolute value as far as the polarities differ.

Accordingly, electrostatic is normally induced between the surface of the electrode group 103 and the handling object 104 by the voltage applied in the time t5 to attract the handling object 104 such as electric conductor, semiconductor, and high-resistance body again to the insulating material 102 by the electrostatic attraction; thus, the handling object 104 can be held to the insulating material 102 (loading).

More particular, when the switch is turned on in accordance with the ON/OFF operation of the switch, the controller 105 used in the present invention is adopted to apply the voltage whose polarity is opposite to the voltage applied to each of the electrode element groups 103a, 103b before the previous switch SW is turned off. Accordingly, even though dipole polarization and space-charge polarization whose relaxation times are long are developed and progresses in the insulating material, these internal polarizations are instantly eliminated; thus, the handling object 104 can be held.

Consequently, in the conventional electrostatic holding device, by improperly turning on the switch SW with the state that the handling object is not around, the holding ability with respect to the handling object 104 is deteriorated by the internal polarization improperly generated in the insulating material 102 as the holding surface. However, in the electrostatic holding device 100 of the present invention, the internal polarization in the insulating material 102 is immediately eliminated by cycling the switch SW again; thus, a desirable electrostatic attraction can be constantly maintained.

In addition, the operation for improperly turning on the switch SW with the state that the handling object 104 is not around is likely to happen at the time of maintaining the device or adjusting the device. Once the internal polarization develops, the electrostatic attraction extremely deteriorates. However, it is possible for the device according to the embodiment of the present invention to have a practically significant effect such that the internal polarization is eliminated by cycling the switch SW, and the useful electrostatic attraction can be immediately recovered.

Modification Example 1

Hereinafter, an electrostatic holding device of non-contact type (floating type) will be described based on the drawings as a modification example of the electrostatic holding device according to the embodiment of the present invention. The same reference numerals are applied to the portions substantially the same or similar to portions of the embodiment of the present invention.

Figure 3:
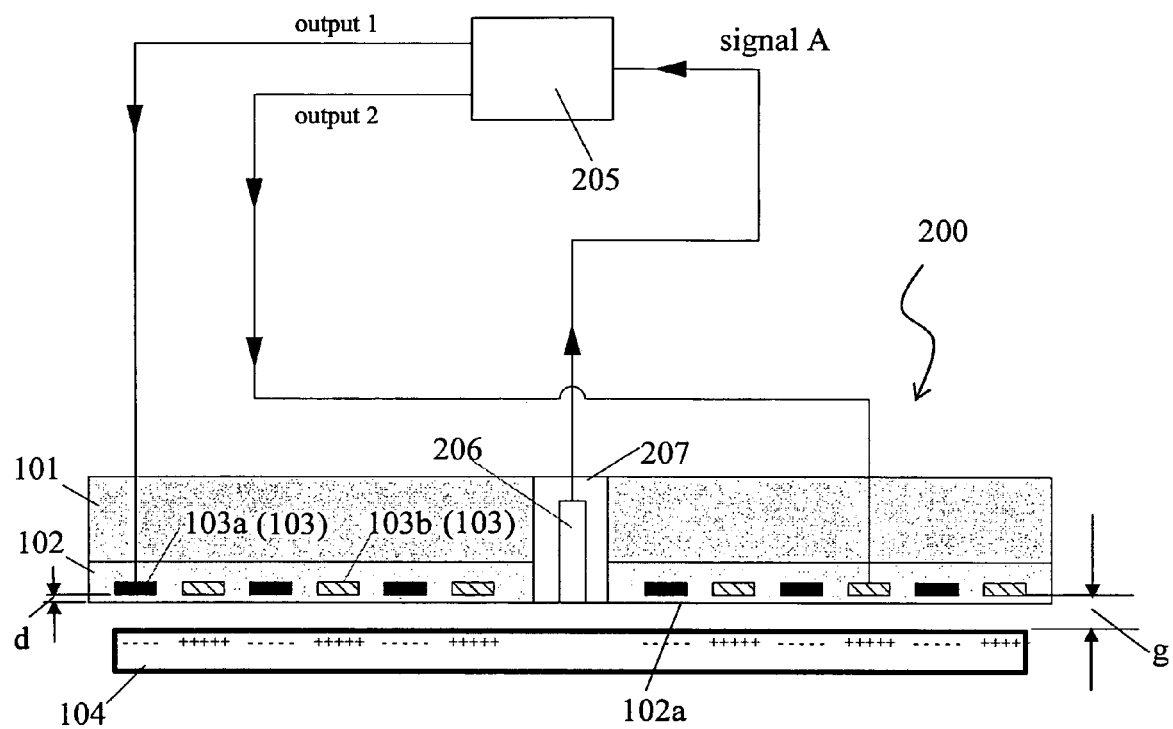
FIG. 3 is a cross section view explanting an example of an electrostatic holding device of floating type according to an embodiment of the present invention.

FIG. 3 is a schematic diagram explaining the concept of the electrostatic holding device of non-contact type according to the modification example of the embodiment of the present invention, and shows a cross section view when the electrostatic holding device is cut by the cross section passing through the center orthogonal to the electrode surface of the electrostatic holding device.

An electrostatic holding device 200 according to the first modification example, an electrode surface 103 is covered with an insulating material 102 which is secured to a base plate 101. A displacement sensor 206 is disposed to feedback a gap g (separation) between the electrode surface 103 and a handling object 104 such as electric conductor, semiconductor, or high-resistance body with actual time. The displacement sensor 206 passes through a through hole 207 to measure the gap g between the handling object 104 and the electrode surface. The displacement sensor 206 feedbacks a signal information (signal) A to the controller 205 as ON information or OFF information indicating the gap g is larger than a predetermined value, or smaller than a predetermined value.

Figure 4:
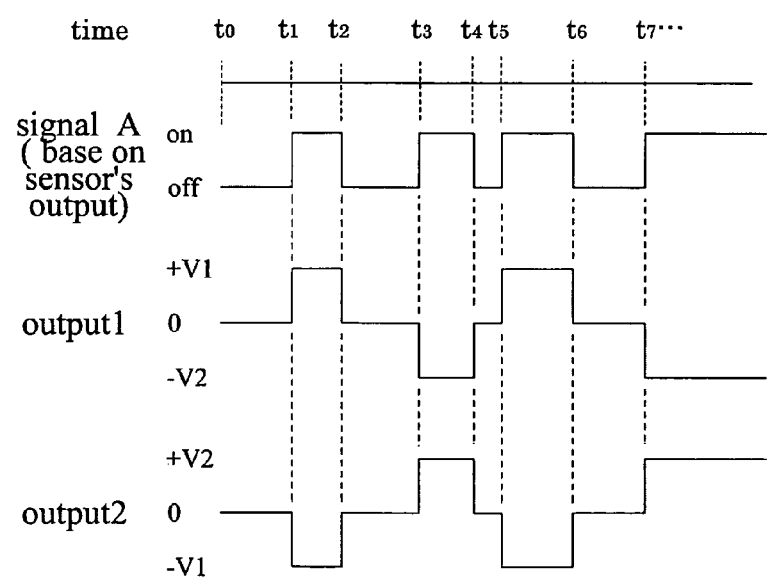
FIG. 4 is a diagram explaining waveforms of voltage to be applied to the electrode of the electrostatic holding device shown in FIG. 3.

In this case, as shown in FIG. 4, based on the signal information A, when the gap g is larger than a target gap (gap>target), predetermined applied voltage is output from the controller 205 to outputs 1, 2, by the input of the ON information from the signal A; when the gap g is smaller than the target gap (gap<target), the outputs 1, 2 from the controller 205 are disconnected by the input of the OFF information from the signal A. In addition, the polarity of the applied voltage output from the output 1 (or output 2) is reversed whenever the ON information is input to the controller 205.

For example, when the main switch is turned on in the time t0 with a state that the handling object 104 is close enough to be held, and the electrostatic holding device including the controller 205 is activated, the handling object 104 is lowered by the own weight, so that the gap g becomes larger than the target gap in the time t1.

Here, in the time t1, the signal information A that the gap g becomes larger than the target gap is input to the controller 205 as the ON information.

The controller 205 outputs +V1 of predetermined positive voltage to the output 1, and outputs −V1 of negative voltage whose polarity is opposite to the output 1 to the output 2. Accordingly, the electrostatic attraction is induced between the handling object 104 and the electrode surface 103 to attract the handling object 104; thus, the gap g is led to become small.

Next, the gap g becomes smaller than the target gap in time t2. In this case, the signal A outputs the OFF information, and the output information is input to the controller 205. The controller 205 disconnects the voltage to be applied to each of the electrodes based on the input OFF information (as 0V) to eliminate the electrostatic attraction between the handling object 104 and the electrode surface 103; thus, the handling object 104 is lowered by the own weight, and the gap g is led to become large.

Next, the gap g again becomes larger than the target gap in the time t3. In this case, the signal A outputs the ON information, and the output information is input to the controller 205. The controller 205 applies predetermined voltage to each of the electrodes based on the input ON information. In this case, the voltage whose polarity is opposite to the voltage previously applied to each of the electrode groups 103a, 103b in time t1 is applied. More particularly, −V2 of predetermined negative voltage is output to the output 1, and +V2 of positive voltage whose polarity is opposite to the previously applied voltage is output to the output 2.

Here, as far as the voltage to be output from each of the outputs 1, 2 is the voltage whose polarities are opposite to the previously applied voltage, respectively, the same absolute value can be used for the V1 and V2, or a different absolute value can be used for the V1 and V2. In other words, as far as the voltage to be applied to the output 1 is negative, the voltage can be −V1 of which the absolute value is equal to +V1 of the previously applied voltage.

Therefore, the electrostatic attraction is induced between the handling object 104 and the electrode surface 103 to attract the handling object 104; thus, the gap g is led to become small. Moreover, when the insulating material 102 includes the internal polarization, the voltage of the reversed polarity is applied to each of the electrodes 103. The internal polarization can be accordingly relaxed or dissolved.

Next, the gap g becomes smaller than the target gap in time t4. In this case, the signal A outputs the OFF information, and the output information is input to the controller 205. The controller 205 disconnects the voltage to be applied to each of the electrodes based on the input OFF information (as 0V) to eliminate the electrostatic attraction between the handling object 104 and the electrode surface 103; thus, the handling object 104 is lowered by the own weight, and the gap g is led to become large.

Next, the gap g again becomes larger than the target gap in the time t5. In this case, the signal A outputs the ON information, and the output information is input to the controller 205. The controller 205 applies the voltage whose polarity is opposite to the voltage previously applied to each of the electrode element groups 103a, 103b in the t3 based on the input ON information. Accordingly, the electrostatic attraction is induced between the handling object 104 and the electrode surface 103 to attract the handling object 104; thus, the gap g is led to become small. Moreover, when the insulating material 102 includes the internal polarization, the voltage of the reversed polarity is applied to each of the electrodes 103. The internal polarization can be thereby relaxed and dissolved.

Next, the gap g becomes smaller than the target gap in time t6. In this case, the signal A outputs the OFF information, and the output information is input to the controller 205. Accordingly, the handling object 104 is led based on the input OFF information such that the gap g becomes large.

Correspondingly, the gap g again becomes larger than the target gap in the time t7. The voltage whose polarity is opposite to the voltage previously applied to each of the electrode groups 103a, 103b in the time t5 is applied based on the ON information of the signal A; thus, the handling object 104 is led such that the gap g becomes small.

According to the above electrostatic holding device 200, as the voltage to be output from the controller 205, the voltage whose polarity is different from the previously applied voltage (reversed polarity) is applied to the same electrode every time switching the applied voltage from disconnecting to applying. Therefore, the internal polarization is not advanced in the insulating material 102 or the internal polarization can be relaxed or dissolved when the internal polarization is included in the insulating material 102.

Second Modification Example

Hereinafter, an electrostatic holding device of contact type will be described based on the drawings as a modification example of the electrostatic holding device according to the embodiment of the present invention. The same reference numerals are applied to the portions substantially the same or similar to the portions of the embodiment of the present invention.

Figure 5:
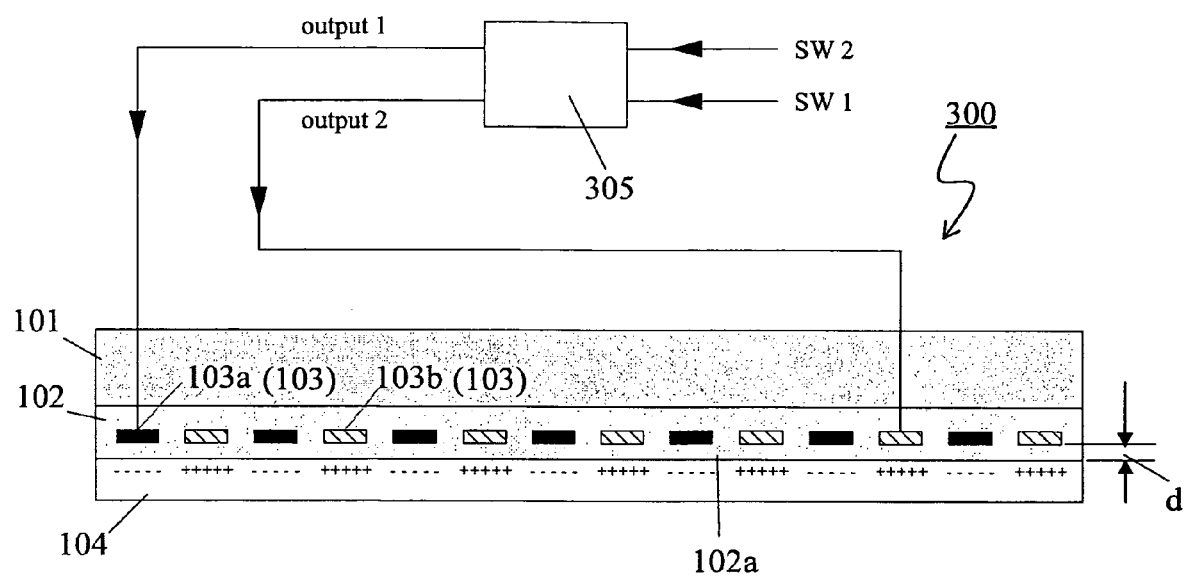
FIG. 5 is a cross section view explaining an example of an electrostatic holding device of contact type according to the present invention.

FIG. 5 is a schematic diagram explaining the concept of the electrostatic holding device according to the modification example of the embodiment of the present invention, and illustrates a cross section view when the electrostatic holding is cut by the cross section passing through the center orthogonal to the electrode surface.

In an electrostatic holding device 300 according to the second modification example, an applied voltage control portion functioning as a voltage of reversed polarity generating device comprising two switches SW1, SW2 and a controller 305 is used instead of using the applied voltage control portion comprising the switch SW and the controller 105 of the electrostatic holding device 100 according to FIG. 1.

Figure 6:
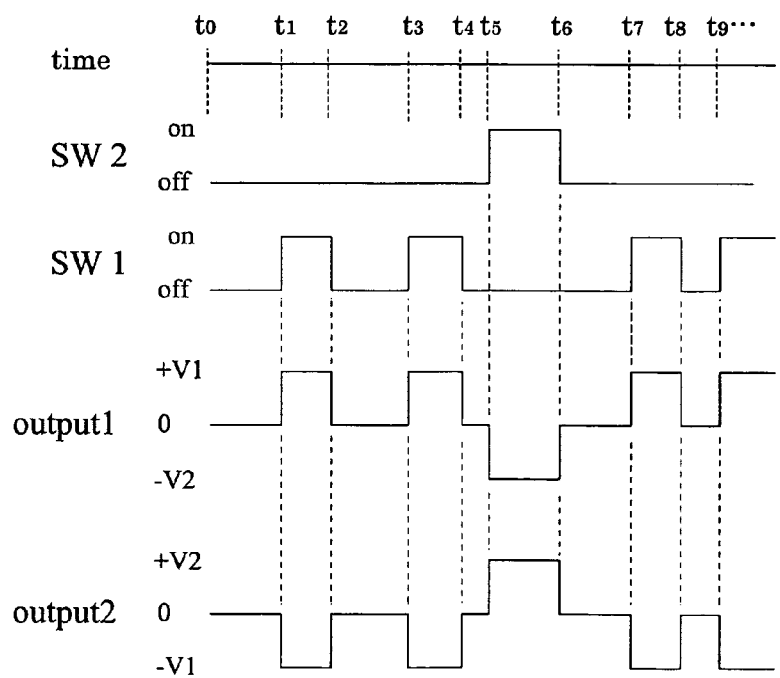
FIG. 6 is a diagram explaining waveforms of voltage to be applied to the electrode of the electrostatic holding device shown in FIG. 5.

According to such an applied voltage control portion, the applied voltage shown in FIG. 6 can be output to the output 1 and output 2 by ON/OFF operation of the switches SW1, SW2.

According to the electrostatic holding device 300, the applied voltage whose polarities are opposite to each other can be output from the outputs 1, 2 by turning on and/or off the switch SW1. Therefore, with the ON state of the switch SW1 (time t1 to t2 and time t3 to t4), +V1 of positive voltage can be applied to the electrode element group 103a and −V1 of negative applied voltage can be applied to the electrode element group 103*b*. Accordingly, the electrostatic attraction is induced between the electrode surface 103 and the handling object 104, and the handling object 104 can be held to the holding surface. In addition, the applied voltage of the outputs 1, 2 can be disconnected by turning off the switch SW1 (time t2 or t4) to eliminate the electrostatic attraction and to dissolve the holding force. Accordingly, the handling operation for loading and unloading the handling object 104 can be performed. Hereinafter, the loading state and the unloading state by means of the switch SW 1 are referred as a handling operation.

In addition, when the switch SW 1 is the OFF state (time t4 to t7), by turning on the switch SW2 (time 5), −V2 of negative voltage whose polarity is different from the polarity of the handling operation can be output from the output 1, and +V2 of positive voltage whose polarity is different from the polarity of the handling operation can be output from the output 2. Accordingly, the applied voltage control portion according to the second modification example functions as the voltage of reversed polarity generating device for generating the voltage whose polarity is opposite to the voltage applied to the electrode 103 at the time of handling.

According to the above electrostatic holding device 300, when the electrostatic holding force is weakened by the internal polarization in the insulating material 102 generated by applying the voltage of the same polarity to the same electrode element group 103*a* or 103*b* at the handing operation, the electrostatic holding force can be recovered by turning on the switch SW2.

More particularly, if the switch SW2 is turned on by the voltage of reversed polarity generating device according to the second modification example with the OFF state of the switch SW1, the voltage whose polarity is different from the time of handing operation is applied to each of the electrodes 103. The internal polarization in the insulating material 102 resulting in weakening the electrostatic holding force is dissolved or relaxed; thus, the electrostatic attraction of the electrostatic holding device can be recovered.

Third Modification Example

Hereinafter, an electrostatic holding device of non-contact type (floating type) will be described as a modification example of the electrostatic holding device according to the embodiment of the present invention based on the drawings. The same reference numerals are applied to the portions substantially the same or similar to portions of the second modification example of the present invention.

Figure 7:
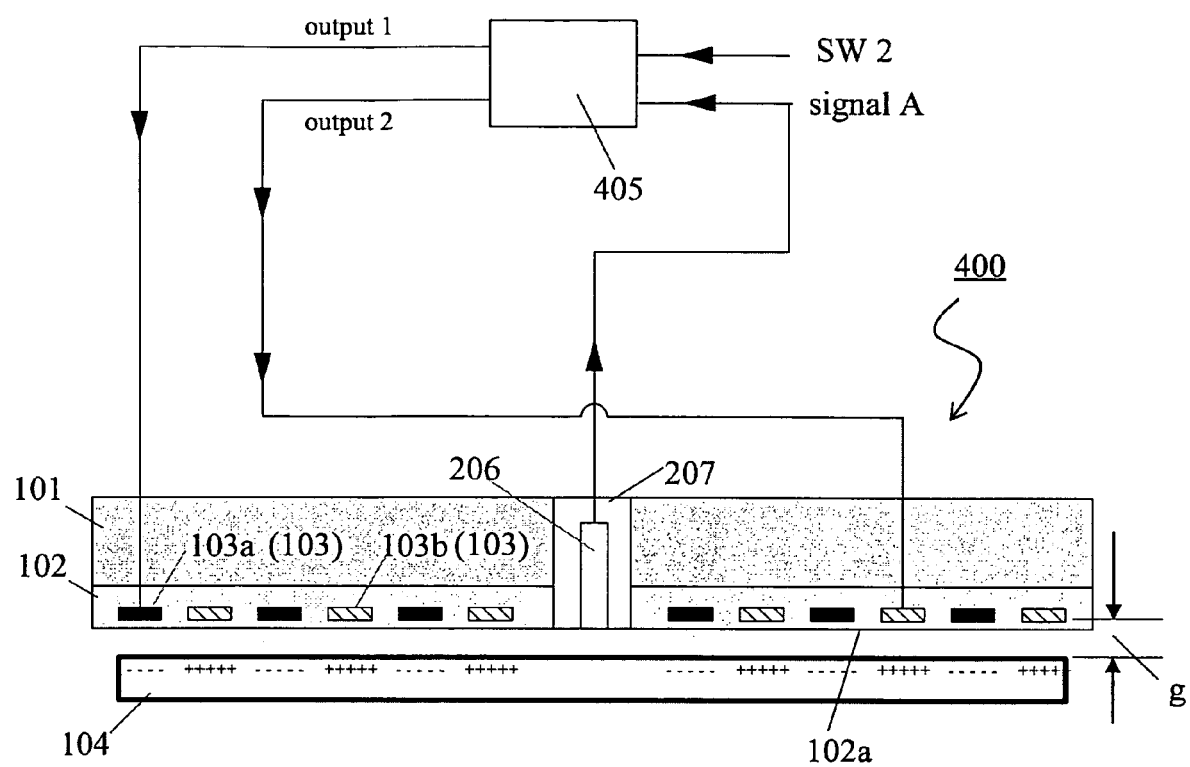
FIG. 7 is a cross section view explaining an example of an electrostatic holding device of floating type according to the present invention.

FIG. 7 is a schematic diagram explaining the concept of the electrostatic holding device 400 of non-contact type according to the modification example of the embodiment of the present invention, and illustrates a cross section view when the electrostatic holding device is cut by the cross section passing through the center orthogonal to the electrode surface of the electrostatic holding device.

In an electrostatic holding device 400 of non-contact type according to the third modification example, a controller 405 capable of controlling the applied voltage by a control signal of a switch SW2 is used as an applied voltage control portion functioning as an applied voltage switching device, in addition to the applied voltage control portion comprising the controller 205 of the electrostatic holding device 200 according to FIG. 3.

Figure 8:
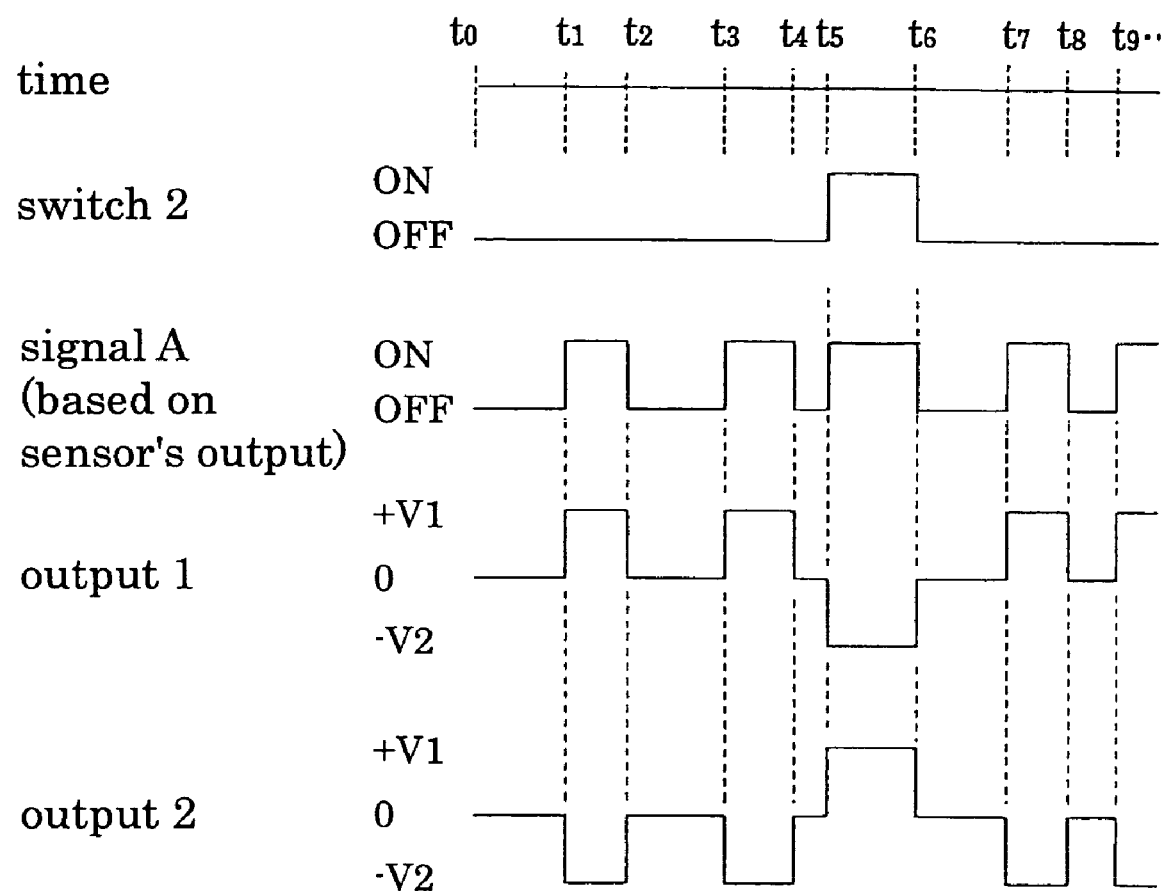
FIG. 8 is a diagram explaining waveforms of voltage to be applied to the electrode of the electrostatic holding device shown in FIG. 7.

According to such an applied voltage control portion, the applied voltage shown in FIG. 8 can be output to the output 1 and output 2 by the ON/OFF information of the signal A and the information of the switch SW2.

More particularly, according to such an electrostatic holding device 400, the applied voltage whose polarities are opposite to each other is output from the output 1 and output 2 based on the ON/OFF information of the signal A. In other words, with the OFF state of the switch SW2, for example, the controller 405 to which the ON information of the signal A is input controls the output 1 to output +V1 of the positive voltage and controls the output 2 to output −V1 of the negative voltage; thus, the gap g is reduced by using the electrostatic attraction. In addition, the OFF information of the signal A is input in the time t2 to disconnect the applied voltage (0V for both of the outputs 1, 2), so that the handling object 104 is lowered by the own weight to increase the gap g.

Moreover, the controller 405 in which the ON information of the signal A is input in the time t3 controls the output 1 to output +V1 of the positive voltage and controls the output 2 to output −V1 of the negative voltage. In addition, the controller 405 disconnects the applied voltage (0V for both of the outputs 1, 2) by the OFF information of signal A input to the controller 405 in the time t4.

Next, with the ON state of the switch SW2, for example, the controller 405 to which the ON information of the signal A is input in the time t 5 controls the output 1 to output −V2 of the negative voltage and controls the output 2 to output +V2 of positive voltage; thus, the controller 405 decreases the gap g by using the electrostatic attraction.

When the OFF information of the signal A is input in the time t6, the applied voltage is disconnected (0V for both of the outputs 1, 2). Accordingly, the handling object 104 is lowered by the own weight to increase the gap g.

The controller 405 to which the ON information of the signal A is input in the time t7 controls the output 1 to output +V1 of positive voltage again and controls the output 2 to output −V1 of negative voltage. The controller 405 disconnects the applied voltage by the input of the OFF information of signal A in the time t8.

The handling object 104 can be kept in a predetermined separation by repeating the above controls.

Here, in the electrostatic holding device 400 according to the third modification example, the applied voltage to be output during the time t5 to t6 of the ON state of the switch SW2 has the polarity opposite to the voltage applied during the time t1 to t4. Therefore, the internal polarization is relaxed or dissolved by applying the voltage of the reversed polarity during the time t5 to t6 although the internal polarization is developed and advanced in the insulating material 102 during the time t1 to t4.

As described above, when the electrostatic holding force is weakened by the internal polarization of the insulating material 102 developed by applying the voltage of the same polarity to the same electrode element group 103*a* or 103*b* at the time of handling operation, the switch SW2 is turned on to apply the voltage of the reversed polarity to each of the electrodes 103; thus the internal polarization is dissolved and relaxed, and the electrostatic attraction of the electrostatic holding device can be recovered.

In this case, the polarity of the voltage to be applied to the same electrode is changed by the operation of the switch SW 2; however, the control type and the control timing are free. For example, the applied voltage may be controlled to be applied such that the positive or the negative applied voltage is reversed whenever a predetermined time during the handing operation passes, without depending upon the operation of the switch SW 2.

Fourth and Fifth Modification Examples

Hereinafter, fourth and fifth modification examples of the embodiment of the present invention will be described based on the drawings. The same reference numerals are applied to the portions substantially the same or the similar to the portions of the first embodiment and the first modification example.

Figure 9:
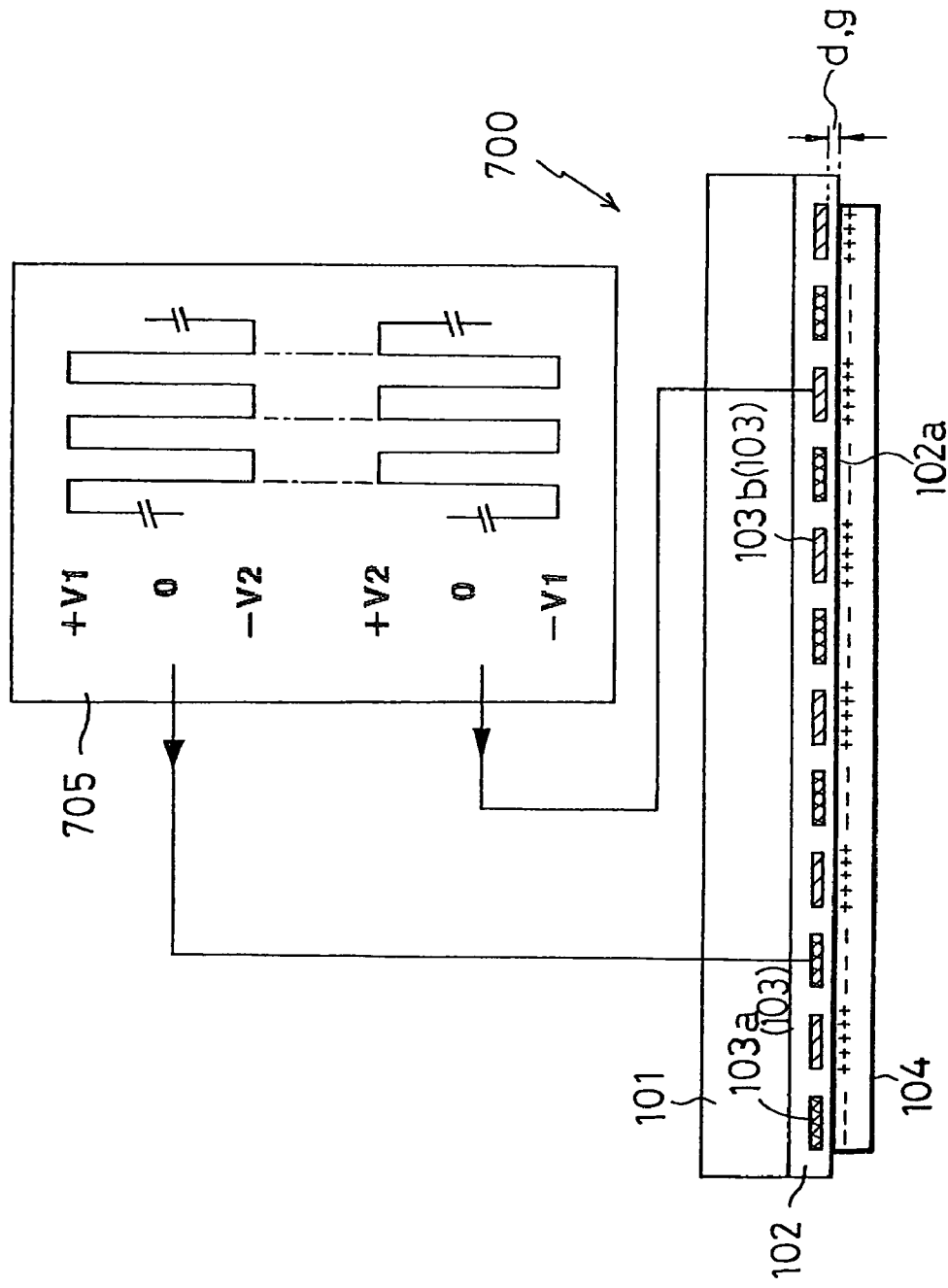
FIG. 9 is a cross section view explaining an example of an electrostatic holding device of contact type according to the present invention.
Figure 10:
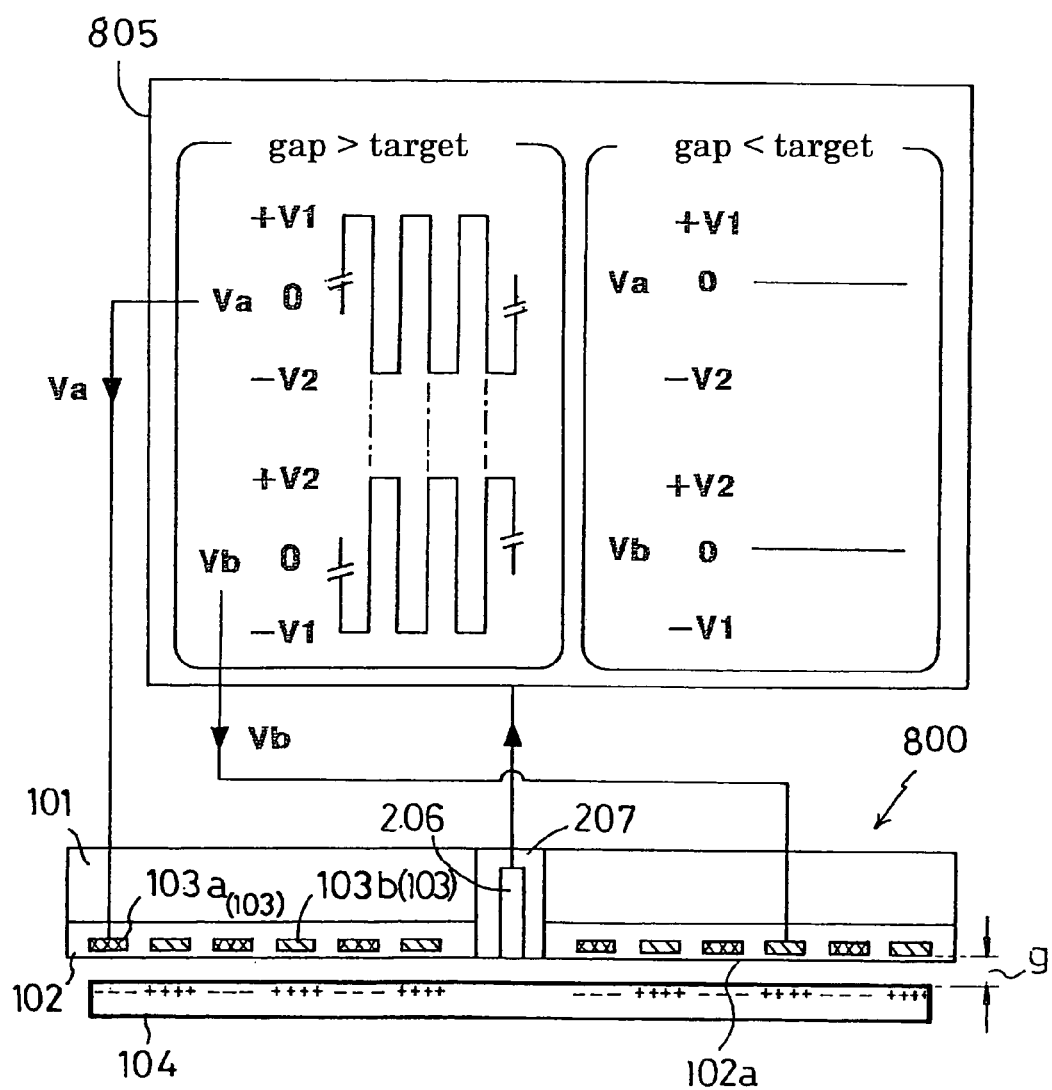
FIG. 10 is a cross section view explaining an example of an electrostatic holding device of floating type according to the present invention.

In this case, FIGS. 9, 10 are schematic diagrams explaining the concept of the electrostatic holding device according to the modification example of the embodiment of the present invention, and illustrate a cross section view when the electrostatic holding device is cut by the cross section orthogonal to the electrode surface, respectively. FIG. 9 shows an electrostatic holding device of contact supporting type; FIG. 10 shows an electrostatic holding device of non-contact supporting type (floating type).

(Electrostatic Holding Device of Contact Type)

In FIG. 9, a reference numeral 700 denotes an electrostatic holding device of contact type, and one surface of a base member 101 is formed with an insulating material 102. An electrode 103 is formed in the insulating material 102 with the periphery of the electrode 103 being covered with the insulating material 102. The electrode 103 comprises two electrode element groups 103*a*, 103*b*. Each of the electrodes (electrode element groups 103*a*, 103*b*) is connected with a controller 705 for generating the applied voltage whose waveforms are as illustrated in FIG. 9.

More particularly, the controller 705 applies the voltage whose polarities are opposite to each other to the electrode element groups 103*a*, 103*b*, and alternately applies the voltage of the reversed polarity of positive and negative to the same electrode element (applying alternate electric field).

By using the above controller 705, the electric charge of reversed polarity is immediately induced on the surface of the handling object 104 by changing the applied voltage to the voltage of the reversed polarity; thus, constant electrostatic attraction can be obtained at any time without generating the internal polarization in the internal portion of the insulating material 102.

The conversion frequency of the applied voltage is not particularly limited; for example, the frequency is not over several hundred Hz. Moreover, it is preferable for the waveforms of alternate electric field to be the rectangular waves as illustrated in FIG.

(Electrostatic Holding Device of Floating Type)

In an electrostatic holding device 800 according to the modification example 5 of the present invention shown in FIG. 10, a controller 805 is used to alternately apply the voltage of positive electrode and negative electrode at any time to the same electrode element.

By using such a controller 805, when increasing the gap g (distance) with respect to the handling object 104, the applied voltage is disconnected to lower the handling object 104 by the own weight, and when reducing the gap g, two types of voltage whose polarities are different to each other are alternately applied as shown in FIG. 10. Accordingly, the electrostatic attraction is prevented from continuously deteriorating, and stable floating support can be achieved without generating the internal polarization in the insulating material 102.

If the electrostatic holding devices described in the above embodiment and the modification examples are used, the object can be freely held with the floating state or the holding of the object can be freely released without using a grasping device. Therefore, the electrostatic holding device of the present invention is expected to be used for a handling device and electrostatic floating system of a thin film, and also is expected to be used as various stages for positioning of electrobeam machining and a photolithography machine and as an electrostatic floating device for vibration controls of a precision instrument and component or for a hard disk.

Moreover, if the electrostatic holding device of floating type is used, the object can be freely held with the floating state without using a grasping device or the holding of the object can be freely released. Therefore, the electrostatic holding device of floating type is expected to be used for a handing device, electrostatic transportation device, various floating systems and the like of a thin film such as a semiconductor wafer. Such an electrostatic holding device of floating type is also expected to be applied to various electrostatic chucks which do not have wear, generation of dust and the like.

Furthermore, according to the above electrostatic holding device, the internal polarization developed in the insulating material can be eliminated or relaxed, or the internal polarization is not developed even if the switch is turned on with the state that the handling object is not around, so that a stable electrostatic holding force can be constantly obtained. Accordingly, a significant effect can be obtained by applying the electrostatic holding device of the present invention to a device for manually performing the handling such as electrostatic tweezers.

Another Embodiment of the Present Invention

Hereinafter, an embodiment of the present invention will be described based on the drawings. FIGS. 9, 10 are schematic diagrams explaining the concept of the electrostatic holding device according to the embodiment of the present invention respectively, and illustrate cross section views when the electrostatic device is cut by the cross section passing the center orthogonal to the electrode surface of the electrostatic holding device respectively. In this case, FIG. 9 shows an electrostatic holding device 700 of contact supporting type; FIG. 10 illustrates an electrostatic holding device 800 of non-contact supporting type (floating type). Both of the devices can keep the electric field between a handling object 104 and a surface of an electrode 103 in high by minimizing the current in the insulating layer even when the electric resistance is not high due to the adhesive contained in an insulating material 102.

(Electrostatic Holding Device of Contact Type)

In FIG. 9, a reference numeral 700 denotes the electrostatic holding device of contact type, the layer of the insulating material 102 is applied onto one surface of a base member 101. An electrode 103 is formed in the insulating material 102 with the periphery of the electrode 103 being covered with the insulating material 102. The electrode 103 comprises two electrode element groups 103*a*, 103*b*.

A handling object 104 can be attracted and held to a holding surface 102*a* of the insulating material 102 with the electrostatic attraction by inducing the electrostatic between the surface of the electrode 103 (electrode surface 103) and the handling object 104. Any of the material such as electric conductor, semiconductor, or high-resistance body can be handled as the handling object 104.

In this case, the electrostatic attraction generated at this point is inversely proportional to the square of the distance between the handling object 104 and the electrode 103 (thickness of insulating material d or gap g). Accordingly, in order to induce a sufficient electrostatic force, it is important for the insulating material 102 to be thinly formed as long as the insulating material 102 satisfies the withstand voltage.

For example, the thickness of the insulating material (thickness of insulating layer) d is about 150 μm and the thickness tolerance within 20 μm is required when 1 kV is applied to the electrode surface. The facilitated and inexpensive method is to secure an insulating film onto the electrode surface though an adhesive layer in order to form the insulating film requiring the above thickness and dimensional accuracy on the entire surface of the electrode surface of 1 m$^2$ surface area.

However, the insulation performance deteriorates when the adhesive is used for forming the insulating layer. This is because the adhesive contains a small amount of various solvent to strength the adhesive force, and these solvent is considered to decrease the insulating resistance.

When the adhesive layer is provided between the neighboring two electrode element groups 103a, 103b whose polarities are different to each other, or between the electrode surface and the handling object 104, as shown in FIG. 19, the electrostatic force deteriorates as time passes. This is because, if the insulating performance is not sufficient, the internal polarization progresses while a small amount of current flows in the insulating layer as time passes although the voltage is applied to the electrode surface by a constant voltage. The flow of the small mount of current drastically increases as the internal polarization of the adhesive layer progresses, and disorders the electric field once formed between the electrode surface and the handling object 104; thus, weakens the electrostatic attraction generated to the handling object 104. In addition, a large amount of current may instantaneously generate with the complete destruction of the insulating layer, as the case may be; thus, the electrode surface or the handling object 104 may be physically destroyed.

Therefore, when the voltage whose polarities are opposite to each other is always applied to each of the electrode element groups 103a, 103b, the once induced electrostatic force deteriorates as time passes although fixed voltage is kept applied to each of the electrode element groups.

Figure 11:
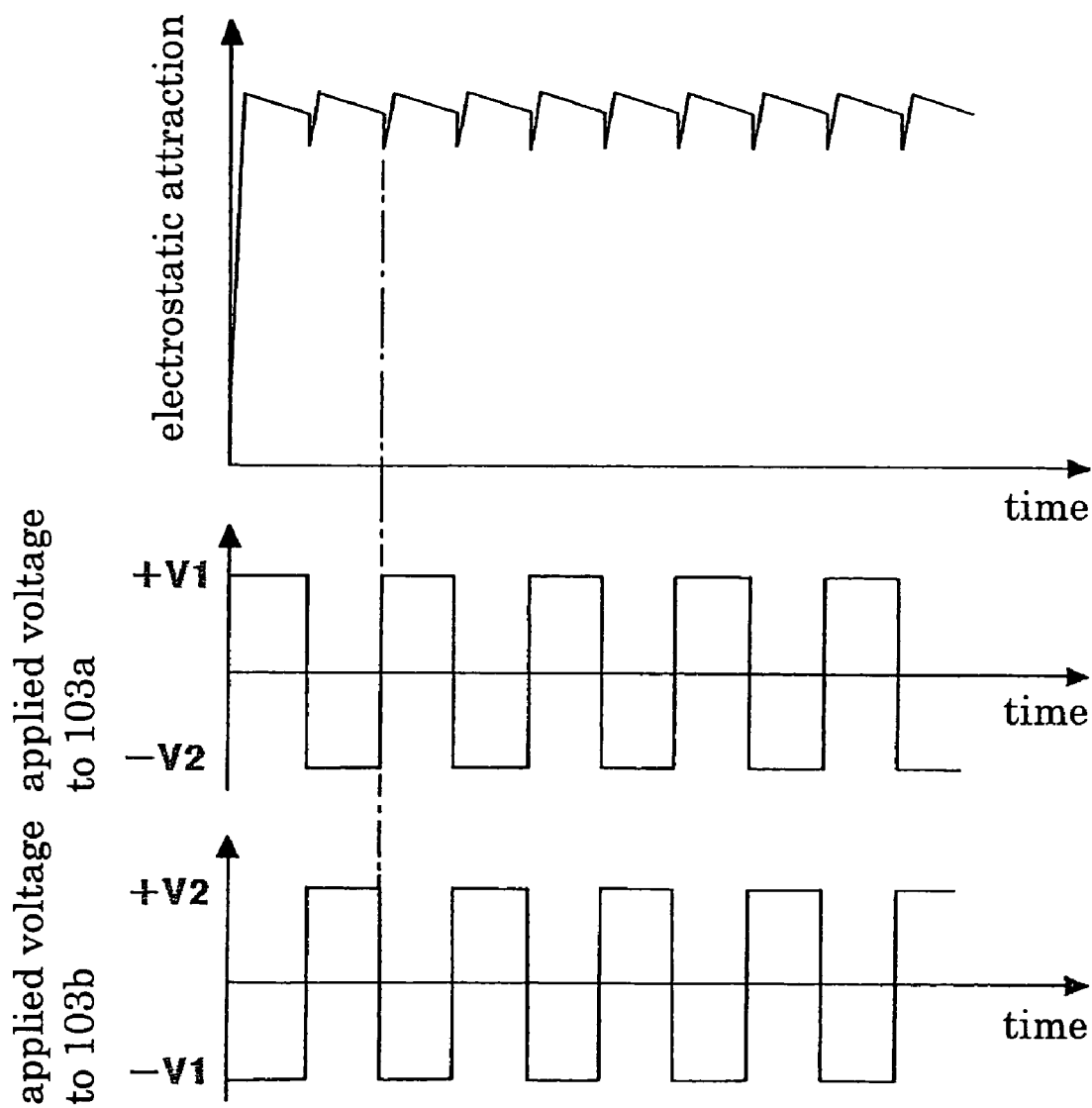
FIG. 11 is a view illustrating temporal changes in the electrostatic force when the electrostatic chuck of FIG. 9 in another embodiment of the present invention is used.

In this case, as a controller 705 used in another embodiment of the present invention, a controller capable of changing the polarity of the applied voltage before the flow volume of a small amount of current (destroyed current) becomes a certain value or more even when a small amount of current flows in the insulating layer is used. Such a controller 705 generates the applied voltage of the waveforms whose polarities are alternately reversed as illustrated in FIG. 11, and prevents the deterioration in the electrostatic force over time.

As described above, the deterioration in the electrostatic force results in the current (hereinafter, referred to destroyed current) increased by the weak dielectric breakdown along with the insulating layer provided between the electrode elements is kept applied to the strong same electric field for a long time. The electrostatic field disorders by this increased destroyed current; thus, the electrostatic force deteriorates.

The controller 705 used in another embodiment of the present invention applies voltage whose polarities are opposite to each other to the electrode element group 103a and the electrode element group 103b, and alternately applies the voltage of reversed polarity of positive and negative to the same electrode element (applying alternate electric field).

When the insulating of the insulating layer is not sufficient, and a small amount of current flows in the insulating layer, the polarity of the applied voltage is changed by using such a controller 705 before the flow volume of a small amount of current (destroyed current) becomes a certain value or more. More particularly, if the voltage is applied such that the positive and negative of the electric field between the electrode elements are inverted before the destroyed current becomes a certain value or more, the polarization direction of the insulating layer provided between the electrode elements is inverted; thus, the dielectric breakdown is dismissed, and the destroyed current stops.

In addition, by changing the applied voltage to the reversed polarity, the electric charge of the reversed polarity is instantly induced on the surface of the handling object 104, and the original electrostatic attraction is again recovered. The handling object 104 can be absolutely held by repeating the above operation without deteriorating the electrostatic force over many hours. Accordingly, the electrostatic force can be kept in a predetermined value or more.

The conversion frequency of the applied voltage depends on a value (absolute value) of electric insulating resistance of the insulating layer. Consequently, it is necessary to raise the frequency when the resistance of insulating layer is low, but if the resistance of the insulating layer is not high, the frequency can be low. It is sufficient for the frequency adopted as a general embodiment to be about not over several hundred Hz.

More particularly, if the applied voltage is formed such that the polarities of the applied voltage are alternately changed within a predetermined time, the electrostatic force fluctuates within a certain predetermined range as illustrated in FIG. 11, but it is possible to prevent the electrostatic force from deteriorating while curving the destroyed current within a certain value. In addition, it is preferable for the waveforms of the alternate electric fields to be rectangular waves shown in FIG.

The electrostatic holding device 700 of contact type can freely hold the handling object 104 or can freely release the holding of the handling object without using a grasping device. The electrostatic holding device 700 is accordingly expected to be applied to an electrostatic transportation device of thin film such as a semiconductor wafer, and a handling device of thin film.

In addition, the electrostatic holding device 700 of contact type is expected to be applied to a holding device or a holding base for holding a thin film of large area for a long time without including flexure, for example, a stage for holding a semiconductor wafer for a long time by various photolithography devices including electrobeam machining.

(Electrostatic Holding Device of Floating Type)

Figure 15:
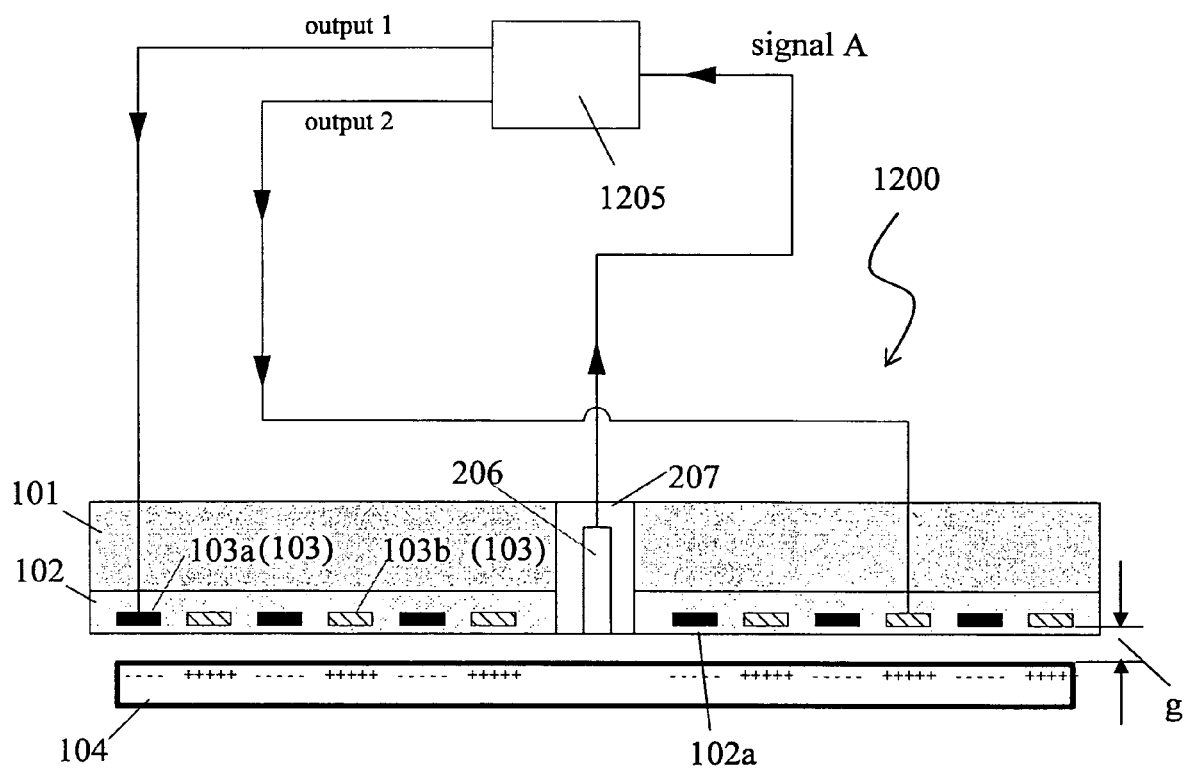
FIG. 15 is a view explaining a conventional electrostatic chuck of floating state.
Figure 16:
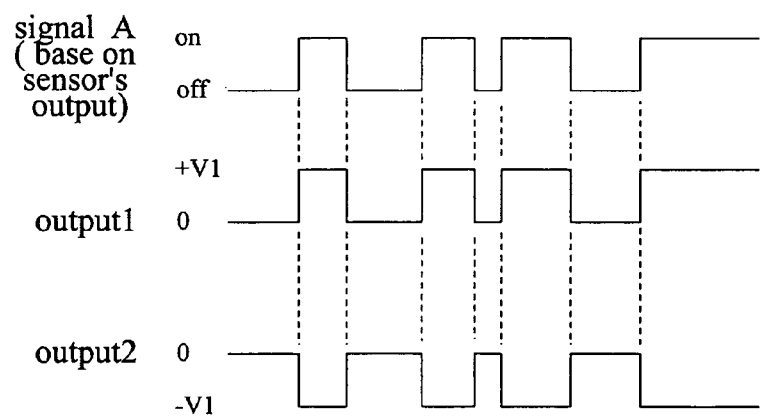
FIG. 16 is a diagram explaining waveforms of voltage to be applied to the electrode of the electrostatic chuck shown in FIG. 15.
Figure 17:
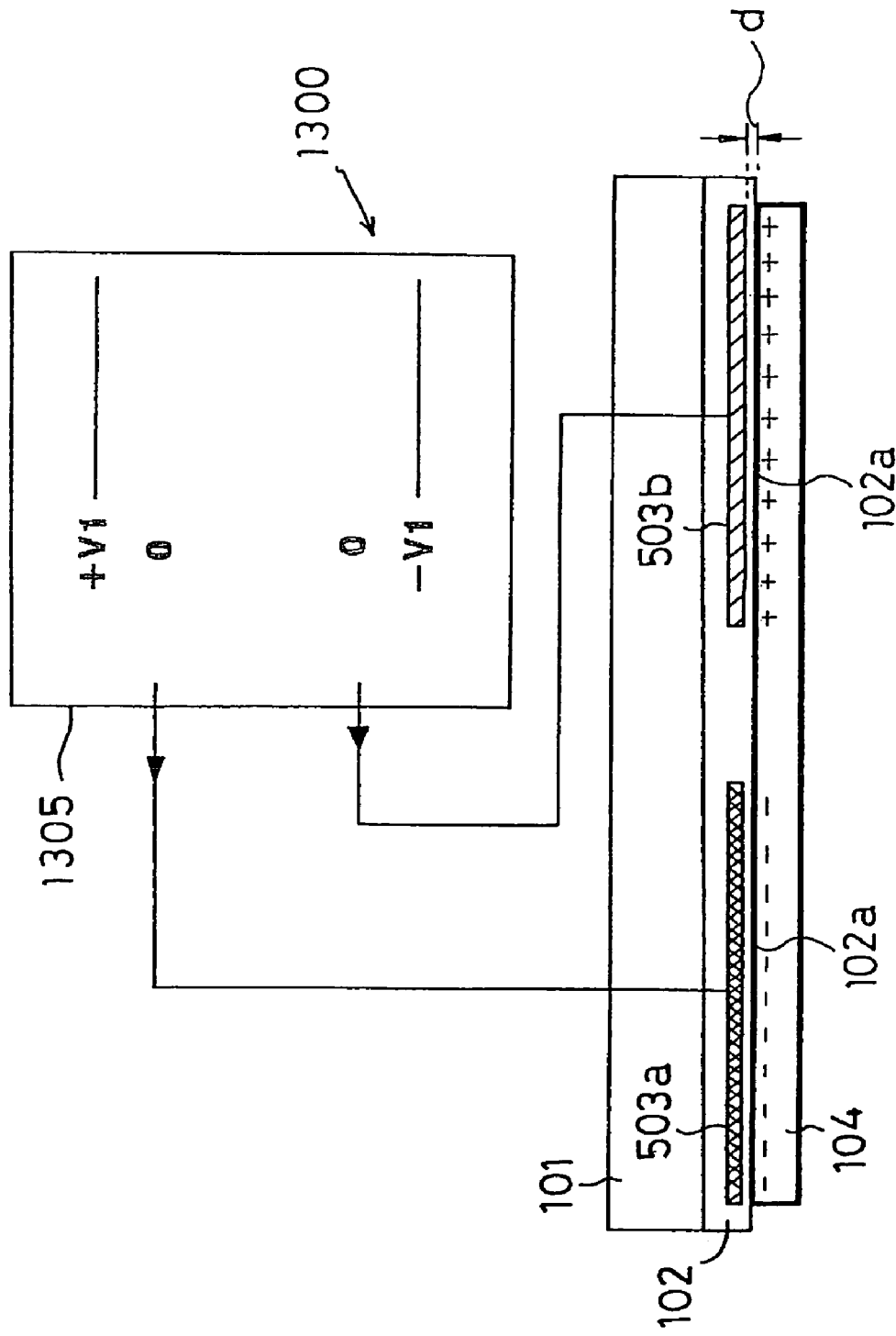
FIG. 17 is a view explaining a conventional thin electrostatic chuck of attachment handling type.
Figure 18:
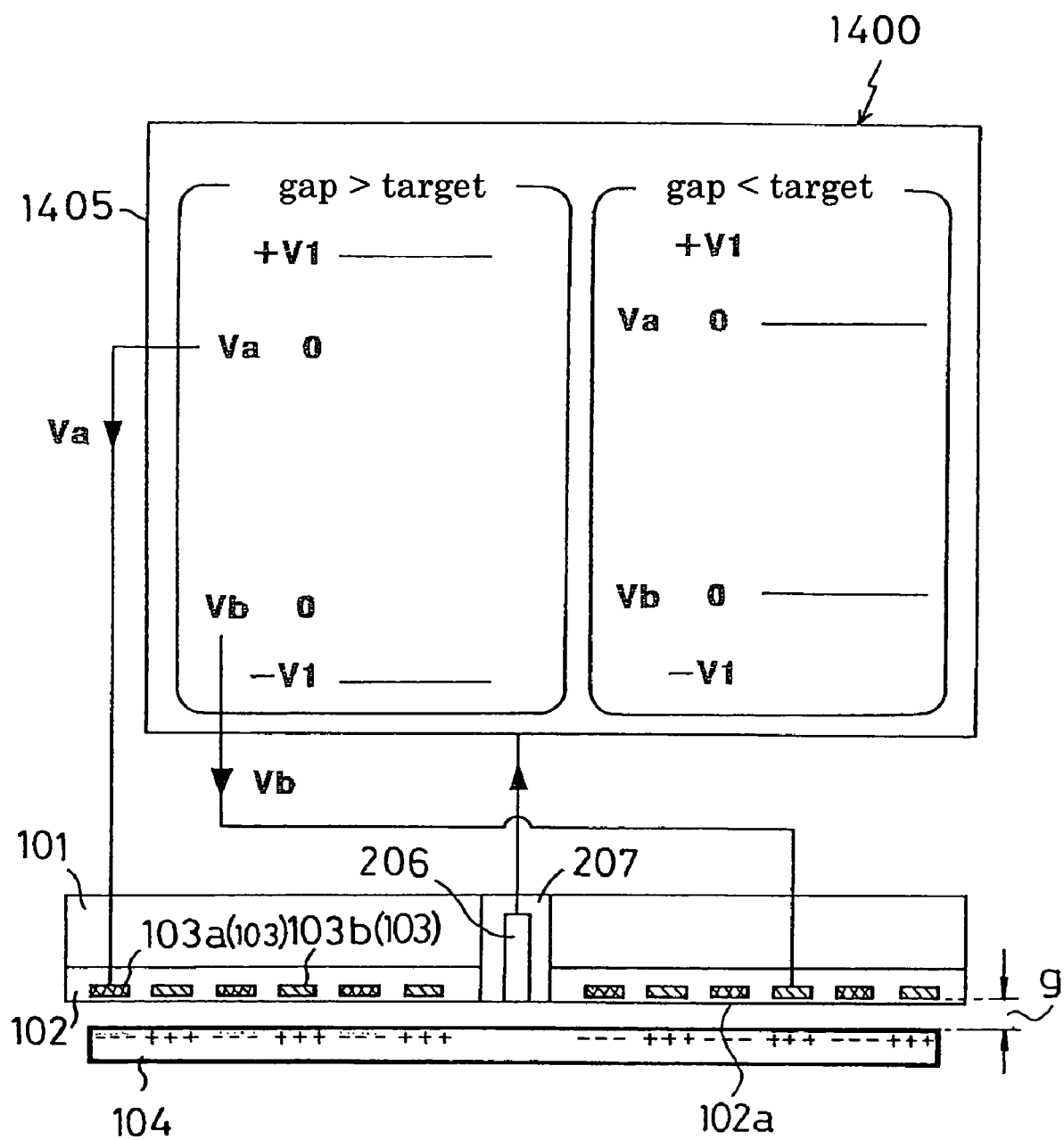
FIG. 18 is a view explaining a conventional electrostatic chuck of floating handling type of thin plate.

According to an electrostatic holding device 1400 of floating type shown in FIG. 18 (substantially the same as the electrostatic holding device 1200 shown in FIG. 15), an electrode surface 103 is covered with an insulating layer 102 which is secured to a base plate 101. A displacement sensor 206 is provided to feedback a gap g (separation) between the electrode surface 103 and a handling object 104 such as electric conductor, semiconductor, or high-resistance body with an actual time.

The displacement sensor 206 passes through a thorough hole 207 to measures the gap g between the handling object 104 and the electrode surface, and the displacement sensor 206 feedbacks the measured gap g to a controller 1405. The controller 1405 controls the applied voltage based on the measured gap g, and keeps the gap g in a previously designated predetermined value. For example, as shown in FIG, when the gap g is larger than a target gap (gap>target), the controller applies predetermined direct-current voltage to induce the electrostatic force; thus, the handling object 104 is attracted to reduce the gap g. On the other hand, if the gap g is smaller than the target gap (gap<target gap), the controller lowers the voltage to be applied to each of the electrodes (as 0V); thus, the attraction to the handling object 104 is deteriorated to increase the gap g. The handling object 104 can be kept in a predetermined gap g by repeating the above operations.

However, if the resistance of the insulating layer is low, the once induced electrostatic force is deteriorated as applying continuous constant voltage; thus, a predetermined supporting force is not obtained as the case may be.

On the other hand, in the electrostatic holding device 800 according to the present invention illustrated in FIG. 10, a controller 805 capable of changing the polarity of the applied voltage before the flow volume of a small amount of current (destroyed current) becomes a certain value or more even when a small amount of current flows in the insulating layer by alternately applying the voltage of the positive electrode and the negative electrode to the same electrode element at any time.

Accordingly, the handling with a floating state can be stably achieved although the insulating layer whose resistance is relatively low is used.

Figure 12:
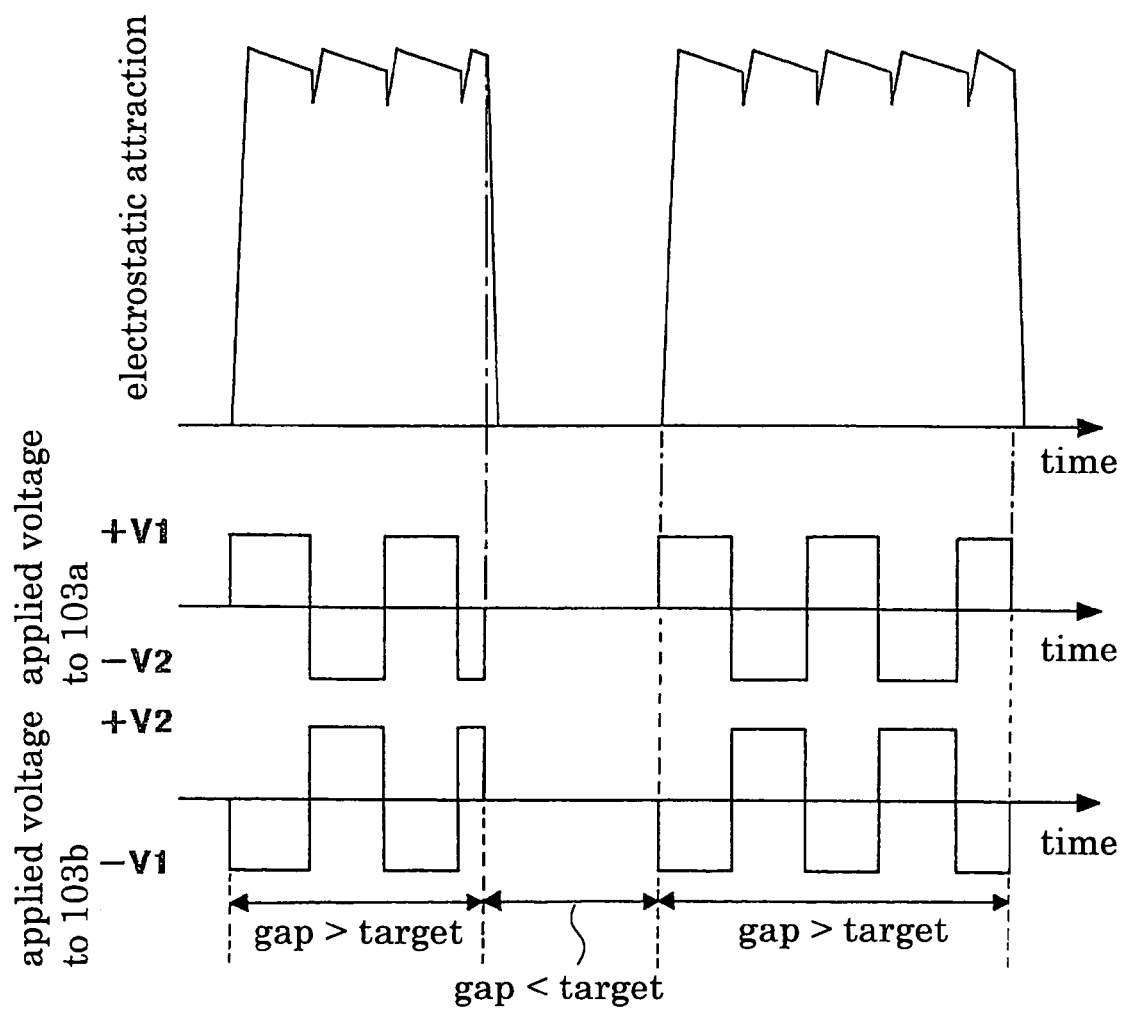
FIG. 12 is a view illustrating temporal changes in the electrostatic force when the electrostatic chuck of FIG. 10 in another embodiment of the present invention is used.
Figure 13:
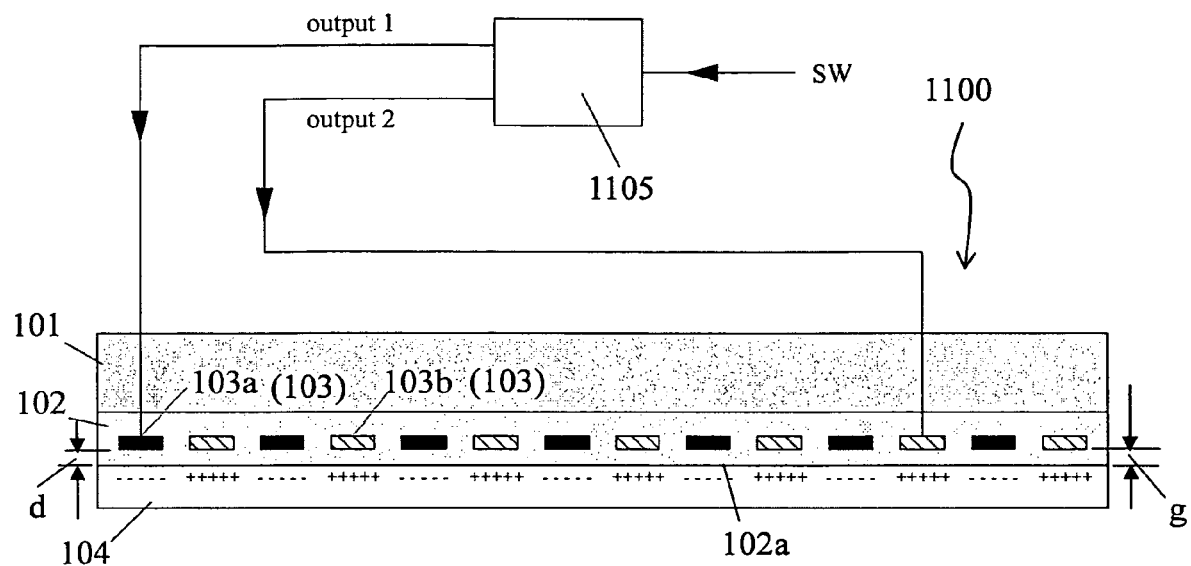
FIG. 13 is a view explaining a conventional electrostatic chuck.
Figure 14:
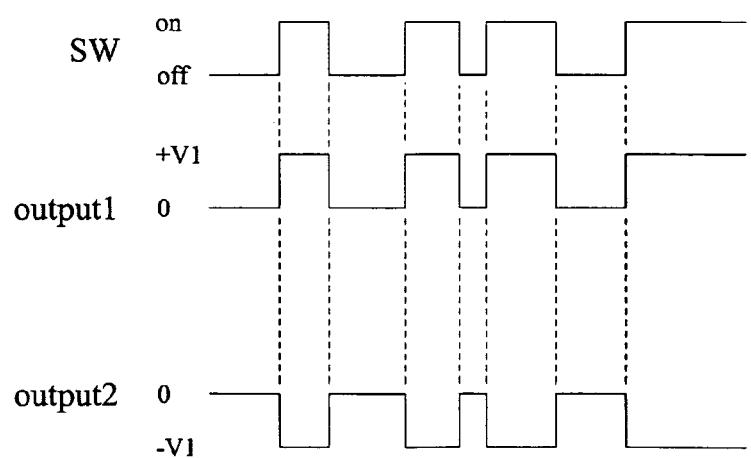
FIG. 14 is a diagram explaining waveforms of voltage to be applied to the electrode of the electrostatic chuck shown in FIG. 13.

By using the controller 805, the handling with a floating state can be stably achieved although the insulating layer whose resistance is relatively low is used. When increasing the gap g (distance) with respect to the handling object 104, the controller disconnects the applied voltage to lower the handling object 104 by the own weight. When reducing the gap g, the controller alternately applies the two types of voltage whose polarities are opposite to each other as illustrated in FIGS. 10, 12; thus, the electrostatic force is prevented from continuously deteriorating, and the stable floating support can be obtained.

Such an electrostatic holding device 800 of floating type is expected to be applied to various electrostatic chucks of desirable non-contact type in terms of the wear and the generation of dust.

Moreover, the object can be freely held or the holding of the object can be freely released by using the above electrostatic holding device 800 without using a grasping device, so that such an electrostatic holding device 800 is expected to be used for a handling device and an electrostatic holding system of thin film member, and also is expected to be used as various stages for positioning with elecrtobeam machining and a photolithography machine and as an electrostatic floating device such as vibration controls of a precision instrument and component, or a hard disk.

By using the electrostatic holding device 800 of floating state, the object can be freely held with a floating state or the holding of the object can be freely released without using a grasping device. Therefore, the electrostatic holding device 800 is expected to be used for a handling device, electrostatic transportation device, and various floating systems of thin film such as a semiconductor wafer.

As described above, the present invention was described based on the drawings; however, the particular structure is not limited to the embodiments, and various changes in form may be made without departing from the sprit and scope of the present invention.

The invention claimed is:

1. An electrostatic holding device in which an electrode group including a plurality of electrodes covered with an insulating material is used as a holding surface, and predetermined voltage is applied to the electrode group to hold a holding object by an electrostatic force with a floating non-contact state, comprising:

an internal polarization eliminating device configured to eliminate an internal polarization generating in the insulating material by switching a polarity of the voltage to be applied to the electrode group;

a distance detecting device configured to detect a distance between the electrode group and the holding object; and a control device configured to control the applied voltage to the electrode group based on distance information detected by the distance detecting device, such that the holding object is held in a direction away from the electrode group while floating in a state that an entire surface of the holding object located in the electrode group side separates from the electrode group at a predetermined distance without having contact with the electrode group.

2. An electrostatic holding device in which an electrode group including a plurality of electrodes covered with an insulating material is used as a holding surface, and predetermined voltage is applied to the electrode group to hold a holding object by an electrostatic force with a floating non-contact state, comprising:

an applied voltage control portion functioning as an applied voltage switching device configured to apply the voltage whose polarity is opposite to previously applied voltage to the same electrode group whenever switching the applied voltage to the electrode group from disconnecting to applying;

a distance detecting device configured to detect a distance between the electrode group and the holding object; and a control device configured to control the applied voltage to the electrode group based on distance information detected by the distance detecting device, such that the holding object is held in a direction away from the electrode group while floating in a state that an entire surface of the holding object located in the electrode group side separates from the electrode group at a predetermined distance without having contact with the electrode group.

3. An electrostatic holding device in which an electrode group including a plurality of electrodes covered with an insulating material is used as a holding surface, and predetermined voltage is applied to the electrode group to hold a holding object by an electrostatic force with a floating non-contact state, comprising:

an applied voltage control portion functioning as a voltage of reversed polarity generating device configured to generate the voltage whose polarity is opposite to the voltage to be applied to the electrode group at the time of handling;

a distance detecting device configured to detect a distance between the electrode group and the holding object; and a control device configured to control the applied voltage to the electrode group based on distance information detected by the distance detecting device, such that the holding object is held in a direction away from the electrode group while floating in a state that an entire surface of the holding object located in the electrode group side separates from the electrode group at a predetermined without having contact with the electrode group, wherein the applied voltage control portion is configured to be capable of applying the voltage of the reversed polarity generated by the voltage of reversed polarity generating device to the electrode group when the electrostatic force deteriorates.

4. An electrostatic holding device in which an electrode group including a plurality of electrodes covered with an insulating material is used as a holding surface, and predetermined voltage is applied to the electrode group to hold a holding object by an electrostatic force with a floating non-contact state, comprising:

an applied voltage control portion functioning as a voltage applying device configured to apply an applied voltage to the electrode group by alternately changing to a reversed polarity;

a distance detecting device configured to detect a distance between the electrode group and the holding object; and a control device configured to control the applied voltage to the electrode group based on distance information detected by the distance detecting device, such that the holding object is held in a direction away from the electrode group while floating in a state that an entire surface of the holding object located in the electrode group side separates from the electrode group at a predetermined distance without having contact with the electrode group.

5. Electrostatic tweezers, comprising: the electrostatic holding device according to claim 1, wherein the holding surface is adopted as an attracting portion of the tweezers.

6. An electrostatic holding device including a control portion for controlling voltage to be applied to an electrode to hold a holding object by an electrostatic force with a floating non-contact state, comprising:

a distance detecting device configured to detect a distance between the electrode group and the holding object, wherein the electrode group includes a pair or two or more pairs of an electrode A and an electrode B adjacently disposed through an insulating area, and the control portion applies the voltage whose polarities are opposite to each other to the electrode A and the electrode B, and alternately applies the voltage of the reversed polarity of positive and negative to the same electrode element, and controls the applied voltage to the electrode group based on distance information detected by the distance detecting device, such that the holding object is held in a direction away from the electrode group while floating in a state that an entire surface of the holding object located in the electrode group side separates from the electrode group at a predetermined distance without having contact with the electrode group.

7. A transportation device or a stage comprising the electrostatic holding device according to claim 1.

8. Electrostatic tweezers, comprising: the electrostatic holding device according to claim 2, wherein the holding surface is adopted as an attracting portion of the tweezers.

9. Electrostatic tweezers, comprising: the electrostatic holding device according to claim 3, wherein the holding surface is adopted as an attracting portion of the tweezers.

10. Electrostatic tweezers, comprising: the electrostatic holding device according to claim 4, wherein the holding surface is adopted as an attracting portion of the tweezers.

11. A transportation device or a stage comprising the electrostatic holding device according to claim 2.

12. A transportation device or a stage comprising the electrostatic holding device according to claim 3.

13. A transportation device or a stage comprising the electrostatic holding device according to claim 4.

14. A transportation device or a stage comprising the electrostatic holding device according to claim 6.

* * * * *